(12) United States Patent
Chang et al.

(10) Patent No.: US 12,021,069 B2
(45) Date of Patent: Jun. 25, 2024

(54) SEMICONDUCTOR DIE AND PHOTOELECTRIC DEVICE INTEGRATED IN SAME PACKAGE

(71) Applicant: TAIWAN SEMICONDUCTOR MANUFACTURING COMPANY LTD., Hsinchu (TW)

(72) Inventors: Jen-Yuan Chang, Hsinchu (TW); Chia-Ping Lai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 70 days.

(21) Appl. No.: 17/081,783

(22) Filed: Oct. 27, 2020

(65) Prior Publication Data
US 2022/0130809 A1 Apr. 28, 2022

(51) Int. Cl.
| | |
|---|---|
| *H01L 25/16* | (2023.01) |
| *H01L 31/02* | (2006.01) |
| *H01L 31/0216* | (2014.01) |
| *H01L 31/0232* | (2014.01) |
| *H01L 31/18* | (2006.01) |

(52) U.S. Cl.
CPC ...... *H01L 25/167* (2013.01); *H01L 31/02005* (2013.01); *H01L 31/02164* (2013.01); *H01L 31/02327* (2013.01); *H01L 31/18* (2013.01)

(58) Field of Classification Search
CPC ............. H01L 25/167; H01L 31/02005; H01L 31/02327; H01L 31/02164; H01L 31/18
See application file for complete search history.

(56) References Cited

U.S. PATENT DOCUMENTS

| | | | |
|---|---|---|---|
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |

(Continued)

FOREIGN PATENT DOCUMENTS

| | | | |
|---|---|---|---|
| JP | 2008192951 A | * | 8/2008 |
| JP | 2010118477 A | * | 5/2010 |

*Primary Examiner* — Herve-Louis Y Assouman
*Assistant Examiner* — Christopher M Roland
(74) *Attorney, Agent, or Firm* — WPAT LAW; Anthony King

(57) ABSTRACT

The semiconductor structure includes a die, a dielectric layer surrounding the die, a photoelectric device disposed adjacent to the die and surrounded by the dielectric layer, a first opening extending through the redistribution layer and configured to receive a light-conducting member, and a dielectric liner extending at least partially through the redistribution layer and surrounding the first opening. A method for forming a semiconductor structure includes forming a dielectric layer to surround a die; and disposing a photoelectric device surrounded by the dielectric layer; forming a redistribution layer over the die, the dielectric layer and the photoelectric device; forming a recess over the photoelectric device; disposing a dielectric material into the recess; removing a portion of the dielectric material to form a dielectric liner and a first opening over the photoelectric device. The dielectric liner extends at least partially through the redistribution layer and surrounding the first opening.

20 Claims, 28 Drawing Sheets

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2009/0315131 A1* | 12/2009 | Hung | H01L 27/14632 257/E31.127 |
| 2010/0053390 A1* | 3/2010 | Takubo | H01L 27/14629 348/294 |
| 2014/0301696 A1* | 10/2014 | Sasaki | G02B 6/4214 29/832 |
| 2015/0001661 A1* | 1/2015 | Tomita | H01L 27/14629 257/432 |
| 2017/0092626 A1* | 3/2017 | Yuan | H01L 21/76898 |
| 2019/0198547 A1* | 6/2019 | Yoshigiwa | H01L 27/14623 |
| 2020/0161284 A1* | 5/2020 | Iida | G02B 6/4214 |
| 2021/0081638 A1* | 3/2021 | Lius | G02F 1/13338 |
| 2022/0128780 A1* | 4/2022 | Chang | G02B 6/4206 |

* cited by examiner

SEMICONDUCTOR DIE AND PHOTOELECTRIC DEVICE INTEGRATED IN SAME PACKAGE

BACKGROUND

The semiconductor industry has experienced rapid growth due to ongoing improvements in the integration density of a variety of components (e.g., photoelectric devices and electrical components, etc.). To accommodate the miniaturized scale of the semiconductor device, various technologies and applications have been developed for the wafer-level packaging, involving greater numbers of different components with different functions. Improvement in integration density has resulted from iterative reduction of minimum feature size, which allows more components to be integrated into a given area. Photoelectric devices have been integrated with semiconductor devices in increasingly more applications in recent years, particularly due to the rising demand for cameras in phones and other portable devices.

Optical signaling and processing are typically combined with electrical signaling and processing to provide full-fledged applications. Accordingly, semiconductor structures integrating photoelectric devices and electrical components such as dies are formed for the conversion between optical signals and electrical signals, as well as the processing of optical signals and electrical signals. Semiconductor structures thus may include both optical (photonic) dies including photoelectric devices and electronic dies including electronic devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
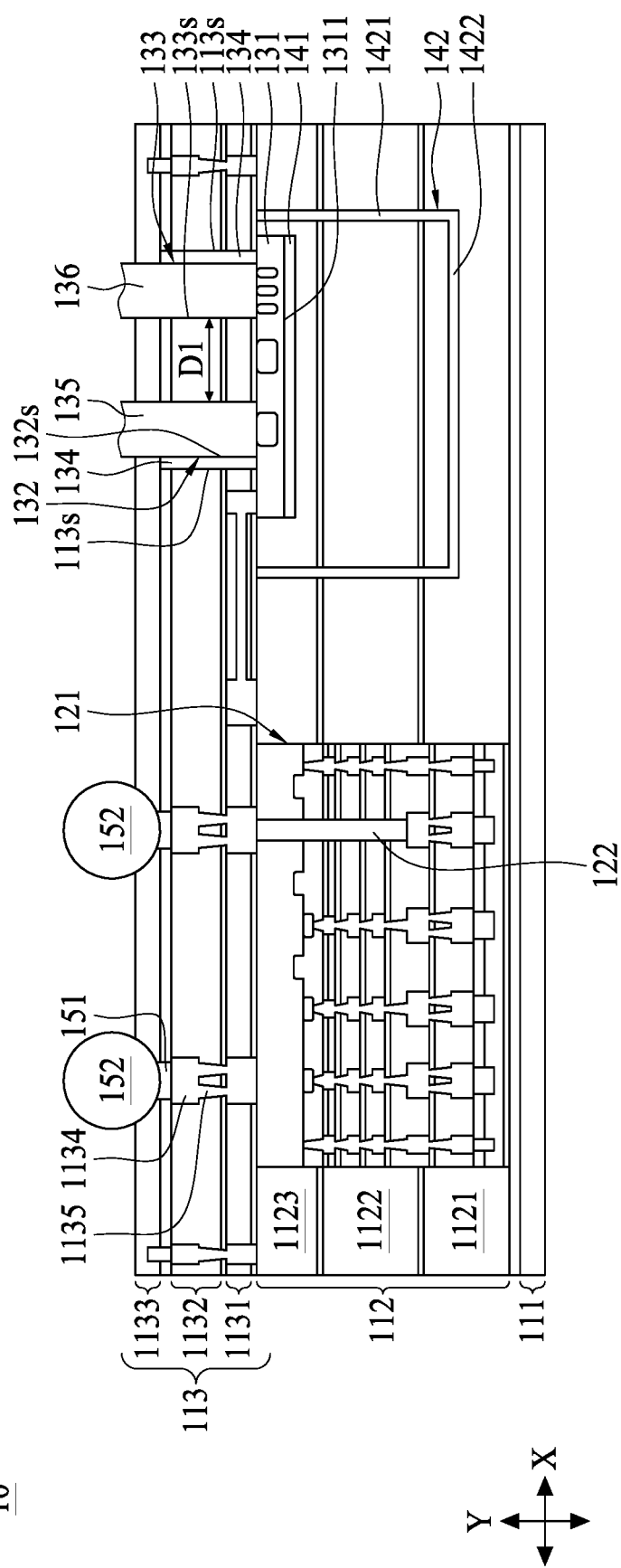
FIG. 1 is a cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In the present disclosure, a semiconductor structure and a method for forming a semiconductor structure are provided. In particular, a semiconductor structure including a die, a photoelectric device and a metallic shield is disclosed below. In addition, a method for forming a semiconductor structure including the photoelectric device and the metallic shield is also disclosed below. Other features and processes may also be included. The semiconductor structure includes the metallic shield configured to minimize interference between the photoelectric device and the die, to reduce optical loss and improve the optical coupling efficiency.

Figure 2:
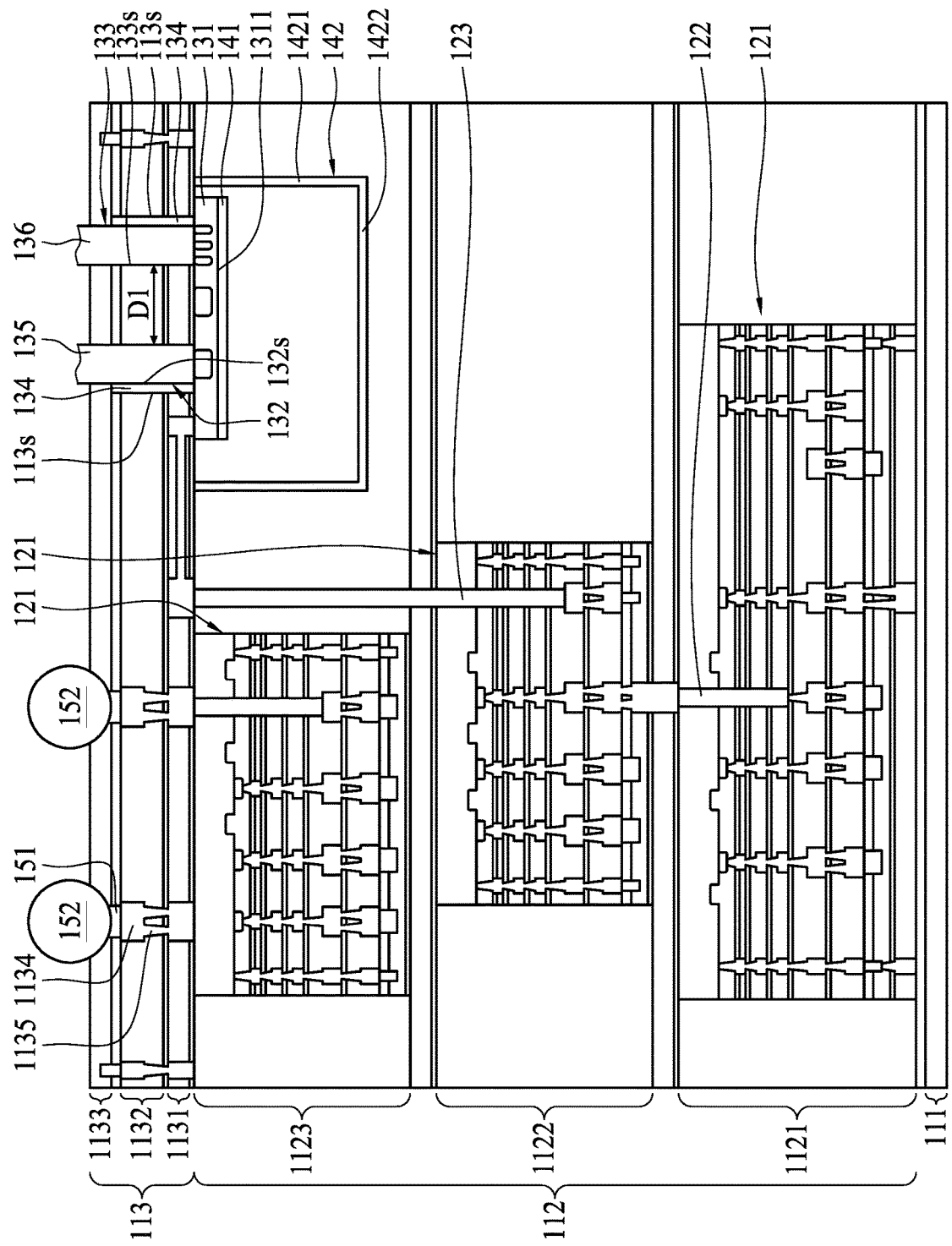
FIG. 2 is a cross-sectional view of a semiconductor structure in accordance with some embodiments of the present disclosure.
Figure 3:
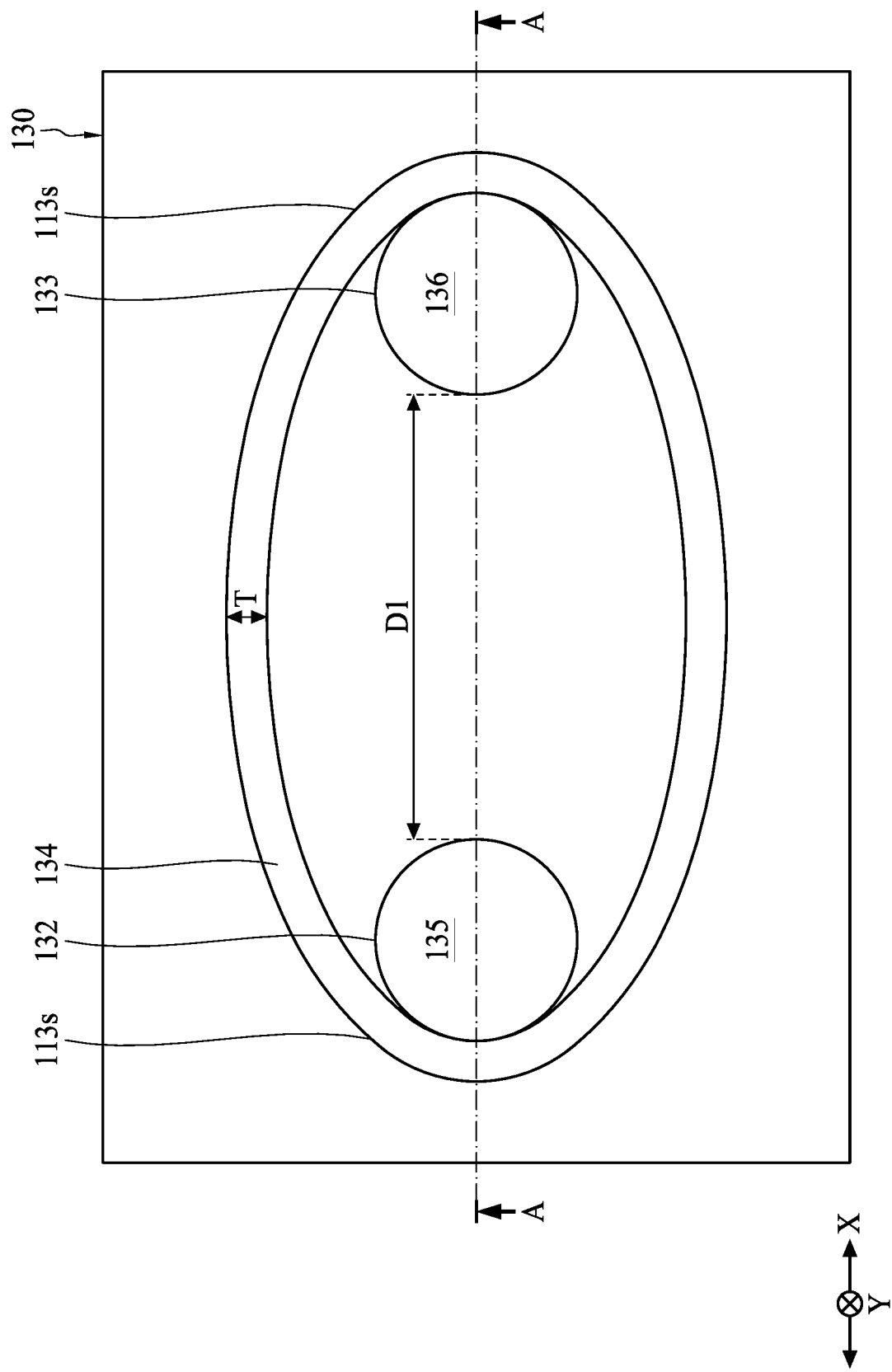
FIG. 3 is a top view of a portion of a semiconductor structure in accordance with some embodiments of the present disclosure.
Figure 4:
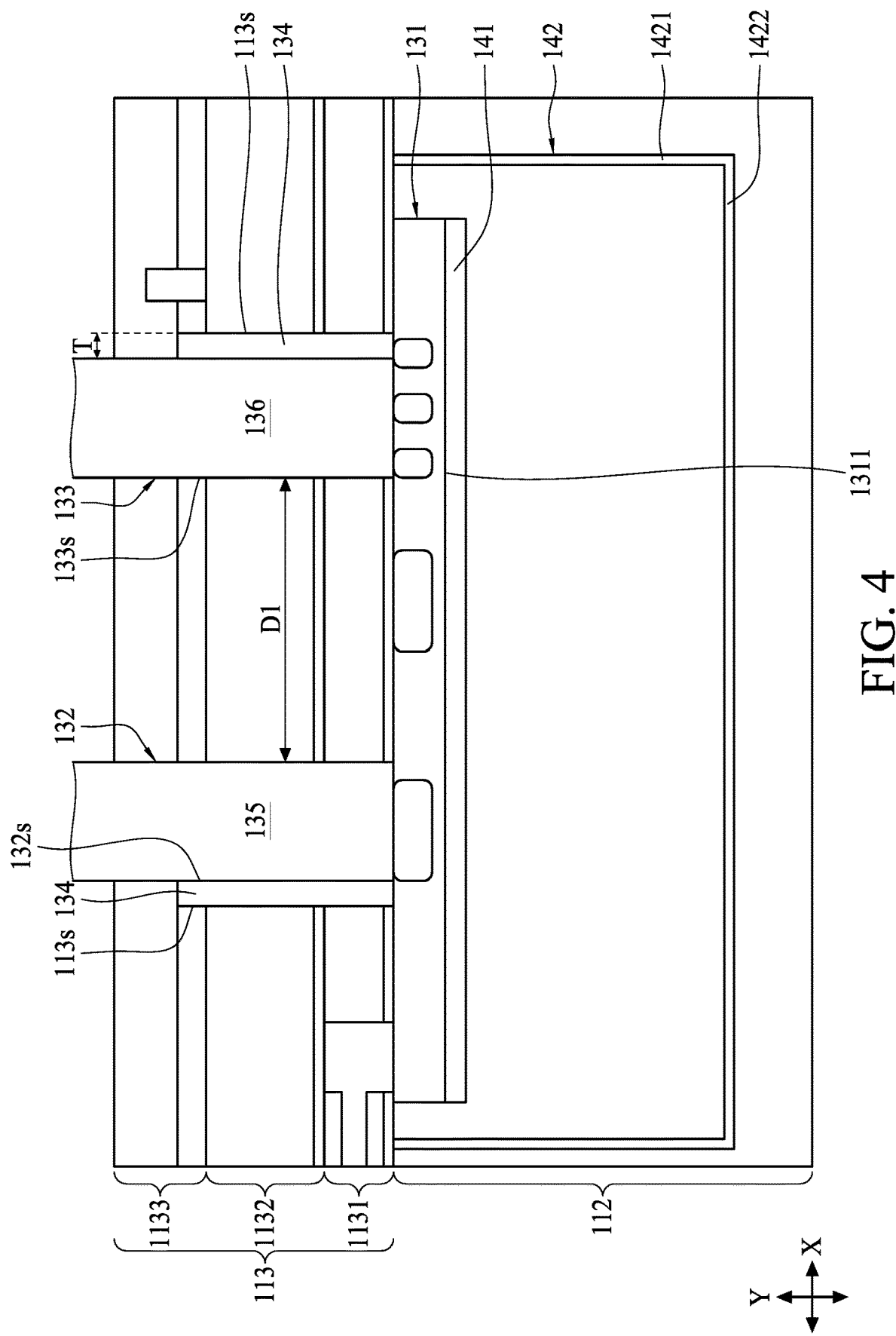
FIG. 4 is an enlarged cross-sectional view of a portion of a semiconductor structure in accordance with some embodiments of the present disclosure.

FIG. 1 is a cross-sectional view of a semiconductor structure 10 in accordance with some embodiments of the present disclosure. FIG. 2 is a cross-sectional view of a semiconductor structure 20 in accordance with some embodiments of the present disclosure. FIG. 3 is a top view of a portion of the semiconductor structure 10 or the semiconductor structure 20 in accordance with some embodiments of the present disclosure. FIG. 4 is a cross-sectional view taken along a line A-A of FIG. 3 of the semiconductor structure 10 or the semiconductor structure 20 in accordance with some embodiments of the present disclosure.

Referring to FIGS. 1 to 4, the semiconductor structure 10 includes a die 121, a dielectric layer 112 surrounding the die 121, and a photoelectric device 131 disposed adjacent to the die 121 and surrounded by the dielectric layer 112. The semiconductor structure 10 further includes a redistribution layer (RDL) 113 disposed over the die 121, the dielectric layer 112 and the photoelectric device 131, a first opening 132 extending through the RDL 113 and configured to receive a first light-conducting member 135, and a dielectric liner 134 extending at least partially through the RDL 113 and surrounding the first opening 132. The dielectric liner 134 may reduce optical loss and increase the amount of light provided to or collected from the photoelectric device 131.

In some embodiments, the dielectric layer 112 is disposed on a substrate 111. In some embodiments, the substrate 111 is a semiconductor substrate, such as a bulk semiconductor, a semiconductor-on-insulator (SOI) substrate, or the like, and may be doped (e.g., with a p-type or n-type dopant) or undoped. The substrate 111 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 111 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In an embodiment, the substrate 111 is a silicon wafer.

In some embodiments, the dielectric layers 112 include low-k dielectric material. The dielectric constant (k value) of the low-k dielectric material may be lower than 3.0, or lower than about 2.5, and the dielectric material is therefore also referred to as an extreme low-k (ELK) dielectric material. In some embodiments, the dielectric layer 112 includes a polymer, such as, for example, polyimide, polyBenzOxazole (PBO), benzocyclobutene (BCB), ajinomoto buildup film (ABF), solder resist film (SR), or the like. In some embodiments, the dielectric layer 112 includes a plurality of dielectric sub-layers 1121, 1122, 1123 disposed over the substrate 111. In some embodiments, the dielectric sub-layer 1121 is disposed on the substrate 111, the dielectric sub-layer 1122 is disposed on the dielectric sub-layer 1121, and the dielectric sub-layer 1123 is disposed on the dielectric sub-layer 1122. Persons having ordinary skill in the art would understand that the number of the dielectric sub-layers shown in FIG. 1 merely serves as an exemplary illustration, and different numbers of the dielectric sub-layers 1121, 1122, 1123 can be included. In some embodiments, the materials included in the dielectric sub-layers 1121, 1122, 1123 are the same material or different materials.

In some embodiments, the die 121 is disposed within the dielectric layer 112. In some embodiments, the die 121 is adjacent to the photoelectric device 131 and surrounded by the dielectric layer 112. In some embodiments, the die 121 is spaced apart from the photoelectric device 131. In some embodiments, an adhesive layer (not shown) is disposed between the die 121 and the substrate 111. In some embodiments, the adhesive layer includes a die attach film (DAF) or another material having adhesive properties. The die 121 can be an electronic integrated circuit (EIC) chip. In some embodiments, the die 121 can provide the required electronic functions of the semiconductor structure 10.

In some embodiments, as shown in FIG. 2, the semiconductor structure 20 includes a plurality of dies 121 surrounded by the dielectric layer 112. The dies 121 may be stacked within the dielectric layer 112. In some embodiments, each of the dielectric sub-layers 1121, 1122, 1123 surrounds at least one die 121. In some embodiments, the dies 121 overlap each other from a top view. In some embodiments, some dies 121 electrically connect to other dies 121 through one or more vias 122. In some embodiments, some dies 121 electrically connect to the photoelectric device 131 through a via 123. Persons having ordinary skill in the art would understand that the number of the dies shown in FIG. 2 merely serves as an exemplary illustration, and different numbers of dies can be included.

In some embodiments, the RDL 113 of the semiconductor structure 10 shown in FIG. 1 or the semiconductor structure 20 shown in FIG. 2 is disposed over the die 121, the dielectric layer 112 and the photoelectric device 131. The RDL 113 may include any combination of inter-metal dielectric (IMD) layers 1131, 1132, passivation layers 1133, metallization layers 1134, and vias 1135. In some embodiments, the metallization layers 1134 and the vias 1135 are disposed in each of the IMD layers 1131, 1132, wherein the metallization layers 1134 and the vias 1135 are metal patterns that provide electrical interconnections through and within the RDL 113. In some embodiments, the metallization layers 1134 are redistribution lines. In some embodiments, the RDL 113 includes a number of metallization layers 1134 in IMD layers 1131, 1132. In some embodiments, the vias 1135 are formed between the metallization layers 1134 in the IMD layers 1131, 1132. In some embodiments, the die 121 is electrically coupled to the RDLs 1134 and the vias 1135.

In some embodiments, the IMD layers 1131, 1132 may include an oxide dielectric, such as a borophosphosilicate glass (BPSG), or other dielectric material. In some embodiments, the conductive materials of the metallization layers 1134 may be, for example, copper, nickel, aluminum, copper aluminum, tungsten, titanium, combinations thereof, and/or the like. In some embodiments, the metallization layers 1134 may include barrier layers (not shown) between the conductive material and the IMD material, and other dielectric layers, such as etch stop layers made of, for example, silicon nitride, may be formed between the IMD layers 1131, 1132.

In the passivation layer 1133, which is disposed on the IMD layers 1131, 1132, an under ball metal (UBM) pad 151 provides the interconnections. In some embodiments, the semiconductor structure 10 further includes a conductive bump 152 disposed over the UBM pad 151. In some embodiments, the die 121 is electrically connected to the conductive bump 152 through the RDLs 1134, the vias 1135 and the UBM pad 151.

In some embodiments, the photoelectric device 131 of the semiconductor structure 10 shown in FIG. 1 or the semiconductor structure 20 shown in FIG. 2 is disposed adjacent to the die 121 and surrounded by the dielectric layer 112 or at least one of the dielectric sub-layers 1121, 1122, 1123. In some embodiments, the photoelectric device 131 is surrounded by the dielectric sub-layer 1123. In some embodiments, a top surface of the photoelectric device 131 is level with a top surface of the dielectric layer 112. In some embodiments, the dies 121 and the photoelectric device 131 are laterally offset from a top view of FIG. 3. In some embodiments, the die 121 is surrounded by the dielectric sub-layer 1123 and is laterally offset from the photoelectric device 131 in a top view of FIG. 3.

The photoelectric device 131 may perform various operations, such as transmitting or processing an optical signal. In some embodiments, the photoelectric device 131 includes optical components such as modulators, waveguides, detectors, gratings, and/or couplers. In some embodiments, the die 121 and the photoelectric device 131 are electrically connected. The photoelectric device 131 may be electrically connected to one of the dies 121 through the electrical interconnections within the RDL 113.

The first opening 132 extends through the redistribution layer 113, and the photoelectric device 131 is at least partially exposed through the first opening 132. In some embodiments, the first opening 132 extends through the redistribution layer 113 to expose at least a portion of the photoelectric device 131. In some embodiments, the photoelectric device 131 includes a waveguide, and the first opening 132 exposes the waveguide.

The first opening 132 is configured to receive the first light-conducting member 135. The first light-conducting member 135 can conduct light of a predetermined wavelength range. In some embodiments, the first light-conducting member 135 includes silicon or glass. In some embodiments, the first light-conducting member 135 is an optical fiber. In some embodiments, the first light-conducting member 135 optically couples to the photoelectric device 131 through the first opening 132.

In some embodiments, the semiconductor structure 10 or the semiconductor structure 20 further includes a second opening 133 extending through the redistribution layer 113 and surrounded by the dielectric liner 134. At least a portion of the photoelectric device 131 is exposed through the second opening 133. The second opening 133 is adjacent to the first opening 132 and configured to receive a second light-conducting member 136. In some embodiments, a distance D1 between the first and second openings 132, 133 is greater than 100 nm. In some embodiments, the shape and size of each of the first and second openings 132, 133 from the top view is not particularly limited, and may be same or different and may be adjusted according to the actual needs.

In some embodiments, the first opening 132 is disposed between the die 121 and the second opening 133. In some embodiments, the second opening 133 extends through the redistribution layer 113 to expose at least a portion of the photoelectric device 131. In some embodiments, the photoelectric device 131 includes the waveguide, and the second opening 133 exposes the waveguide.

Similarly, the second light-conducting member 136 can conduct light of a predetermined wavelength range. In some embodiments, the second light-conducting member 136 includes silicon or glass. In some embodiments, the second light-conducting member 136 is an optical fiber. In some embodiments, the second light-conducting member 136 optically couples to the photoelectric device 131 through the second opening 133.

In some embodiments, the first light-conducting member 135 is configured to transmit light into the photoelectric device 131, and the second light-conducting member 136 is configured to transmit light out of the photoelectric device 131. In some embodiments, the second light-conducting member 136 is configured to transmit light into the photoelectric device 131, and the first light-conducting member 135 is configured to transmit light out of the photoelectric device 131.

In some embodiments, a third opening (not shown) adjacent to the first and second openings 132, 133 is further included in the semiconductor structure 10 or the semiconductor structure 20. The third opening is similar to the first opening 132 or the second openings 133. In some embodiments, the third opening extends through the redistribution layer 113 and exposes at least a portion of the photoelectric device 131. The first opening 132, the second opening 133 and the third opening are surrounded by a dielectric liner 134. Each opening may receive a light-conducting member optically connecting to the photoelectric device 131. Persons having ordinary skill in the art would understand that the number of the openings shown in FIGS. 1 to 4 merely serves as an exemplary illustration, and different numbers of openings can be included.

The dielectric liner 134 is configured to shield the first light-conducting member 135 or the second light-conducting member 136. The dielectric liner 134 may prevent light from scattering. The dielectric liner 134 includes a dielectric material which may reflect, refract and/or absorb light. In order to control the penetration and reflectivity of the light having the predetermined wavelength range, a thickness T of the dielectric liner 134 are adjusted according to a refractive index of the dielectric liner 134, the predetermined wavelength range, etc. Therefore, the light having the predetermined wavelength range passing through the first and second light-conducting members 135, 136 may be totally or mostly reflected by the dielectric liner 134, such that optical loss can be minimized or even prevented.

The dielectric liner 134 extends at least partially through the RDL 113 and surrounds the first opening 132 and the first light-conducting member 135. The RDL 113 includes a sidewall 113s, and the first opening 132 includes a sidewall 132s. In some embodiments, the dielectric liner 134 is disposed along the sidewall 113s of the RDL 113 or the sidewall 132s of the first opening 132. In some embodiments, the dielectric liner 134 is in contact with the sidewall 113s of the RDL 113. In some embodiments, the RDL 113 extends along a first direction X, and the dielectric liner 134 extends along a second direction Y substantially perpendicular to the first direction X. In some embodiments, the first opening 132 and the dielectric liner 134 are extend along the second direction Y. In some embodiments, the passivation layer 1133 is disposed over the dielectric liner 134.

In some embodiments, the dielectric liner 134 extends through the IMD layers 1131, 1132. In some embodiments, the dielectric liner 134 is disposed on the photoelectric device 131. The dielectric liner 134 may be in contact with the photoelectric device 131. In some embodiments, the dielectric liner 134 extends through the RDL 113. In some embodiments, a portion of the dielectric liner 134 extends to the dielectric layer 112. In some embodiments, the dielectric liner 134 is adjacent to the first opening 132 and the first light-conducting member 135. In some embodiments, the dielectric liner 134 is disposed between the RDL 113 and the first light-conducting member 135. In some embodiments, the dielectric liner 134 is in contact with the first light-conducting member 135.

In some embodiments, the dielectric liner 134 surrounds the first and second openings 132, 133 and the first and second light-conducting members 135, 136. In some embodiments, the dielectric liner 134 includes dielectric such as SiC, SiN, SiO$_2$, Al$_2$O$_3$ or a combination thereof. In some embodiments, a material of the redistribution layer 113 and a material of the dielectric liner 134 are different.

In some embodiments, a thickness T of the dielectric liner 134 depends on the wavelength range of the light conducted by the first light-conducting member 135 and/or the material included in the dielectric liner 134. In some embodiments, the thickness T of the dielectric liner 134 is substantially greater than 20 μm. In some embodiments, the thickness of each part of the dielectric liner 134 can be different from a top view.

In some embodiments, the shape of the dielectric liner 134 is a circle, a rectangle or a square from a top view. In some embodiments, the shape of the dielectric liner 134 from the top view is not particularly limited, and may be adjusted according to the actual needs.

Figure 5:
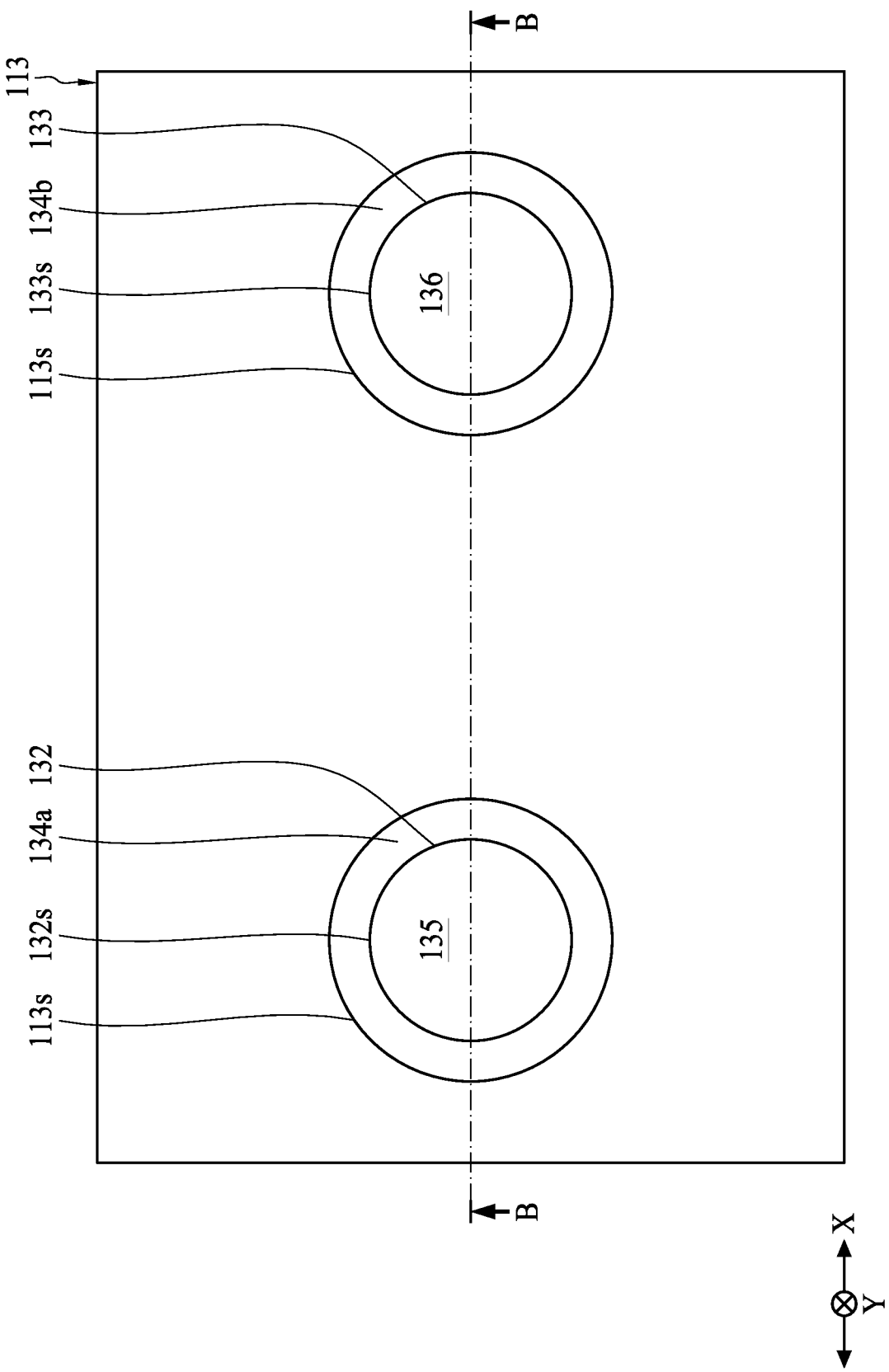
FIGS. 5 and 6 are top views of a portion of a semiconductor structure in accordance with some embodiments of the present disclosure.
Figure 6:
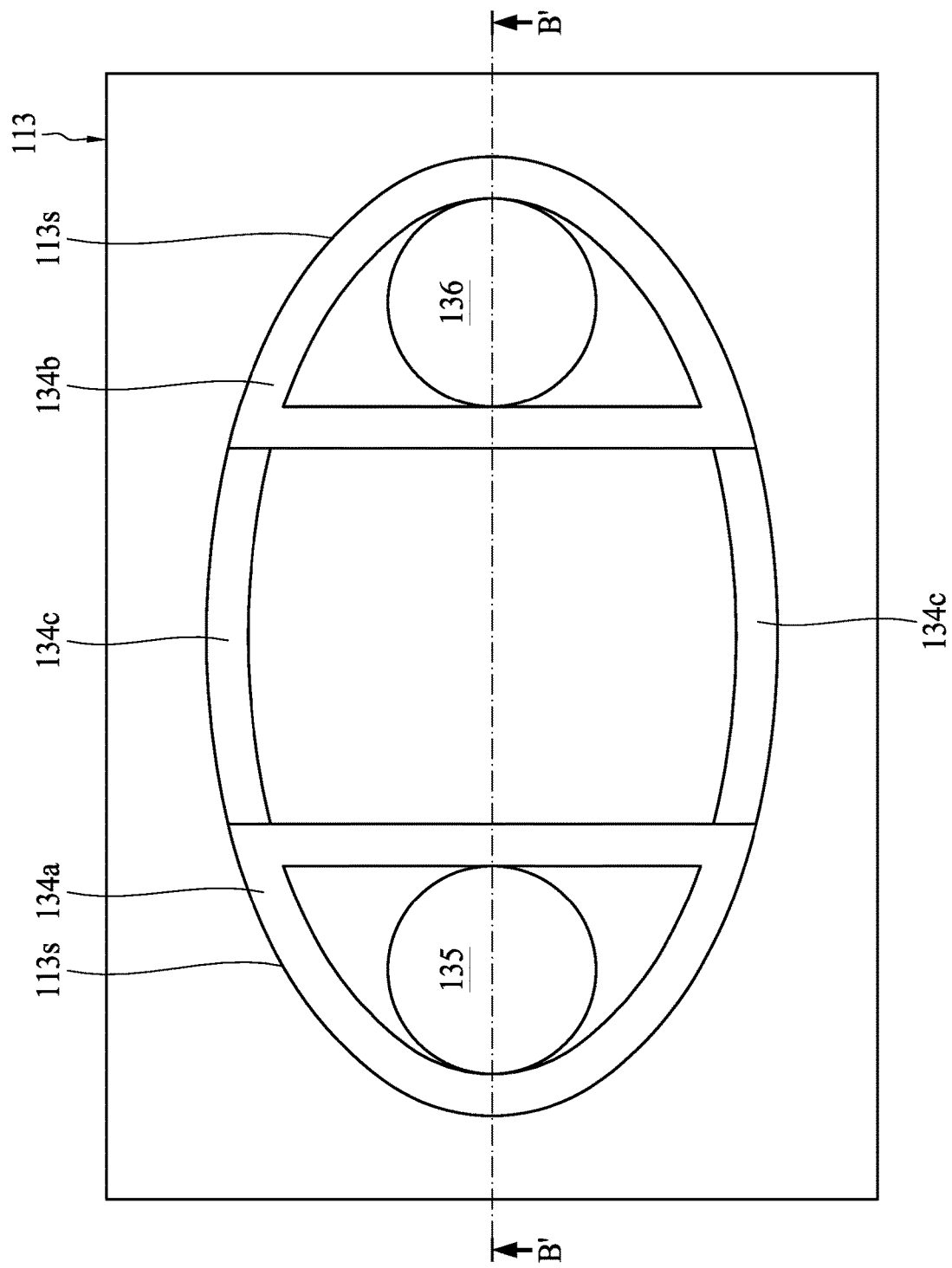
Figure 7:
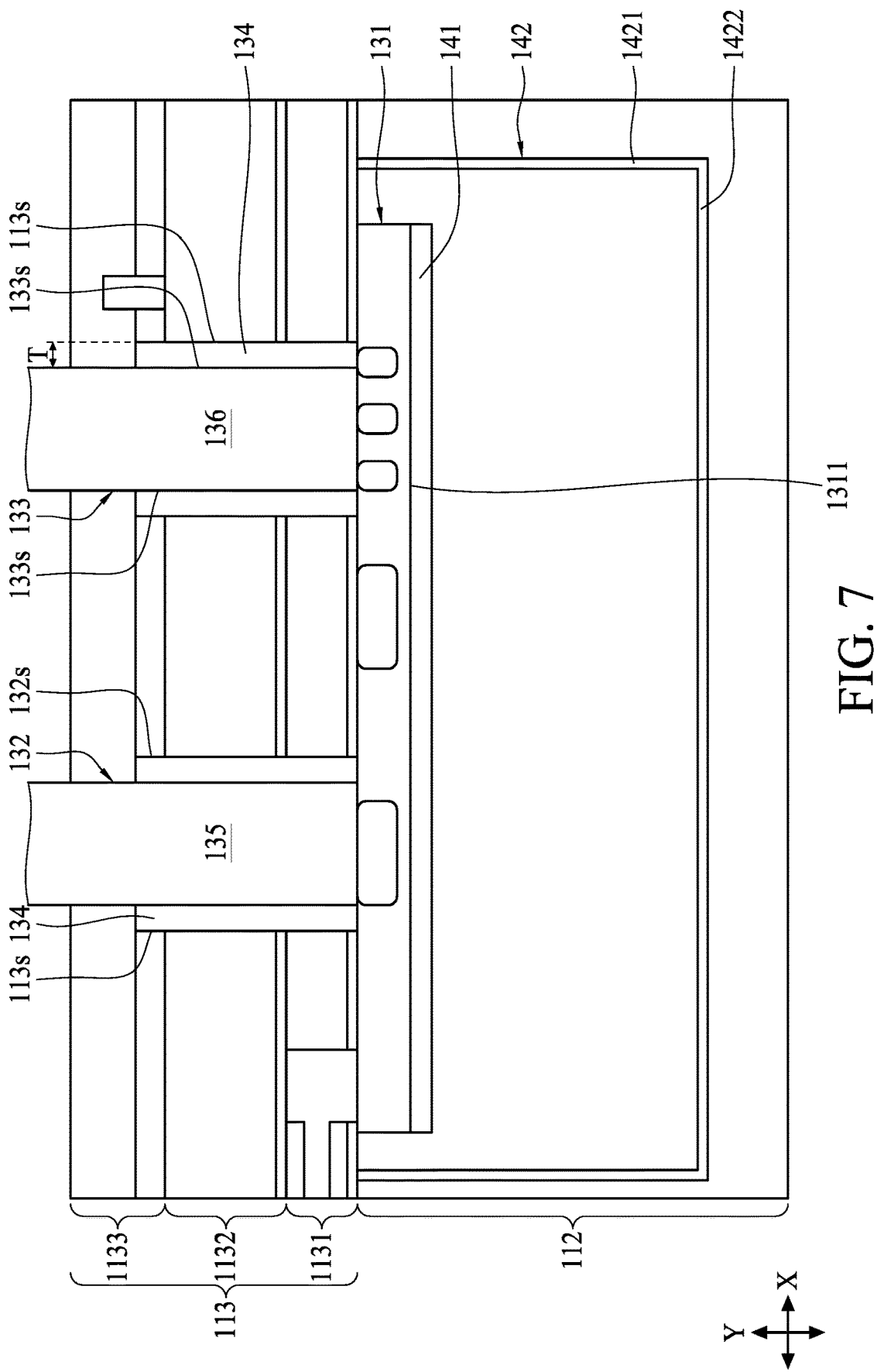
FIG. 7 is an enlarged cross-sectional view of a portion of a semiconductor structure in accordance with some embodiments of the present disclosure.

FIGS. 5 and 6 are top views of a portion of a semiconductor structure 10 or a semiconductor structure 20 in accordance with some embodiments of the present disclosure. FIG. 7 is a cross-sectional view taken along line B-B of FIG. 5 or line B'-B' of FIG. 6 of the semiconductor structure 10 or a semiconductor structure 20 in accordance with some embodiments of the present disclosure.

In some embodiments, a portion of the dielectric liner 134 is disposed between the first and second openings 132, 133 and between the first and second light-conducting members 135, 136. In some embodiments, as shown in FIGS. 5 to 7, a first liner portion 134a surrounds the first opening 132 and the first light-conducting member 135, and a second liner portion 134b surrounds the second opening 133 and the second light-conducting member 136. In some embodiments, the first liner portion 134a and the second liner portion 134b are separated from each other as shown in FIG. 5. In some embodiments, the inner periphery of the first liner portion 134a is the sidewall 132s of the first opening 132. Similarly, the inner periphery of the second liner portion 134b is a sidewall 133s of the second opening 133. In some embodiments, a third liner portion 134c connects the first liner portion 134a and the second liner portion 134b as shown in FIG. 6. In some embodiments, the first liner portion 134a, the second liner portion 134b and the third liner portion 134c are integrated.

Each of a thickness and material of the first and second liner portions 134a, 134b may be similar or different. The first and second liner portions 134a, 134b are illustrated as having similar features, this is intended to be illustrative and is not intended to limit the embodiments, as the first and second liner portions 134a, 134b may have similar structures or different structures in order to meet the desired functional capabilities.

Figure 8:
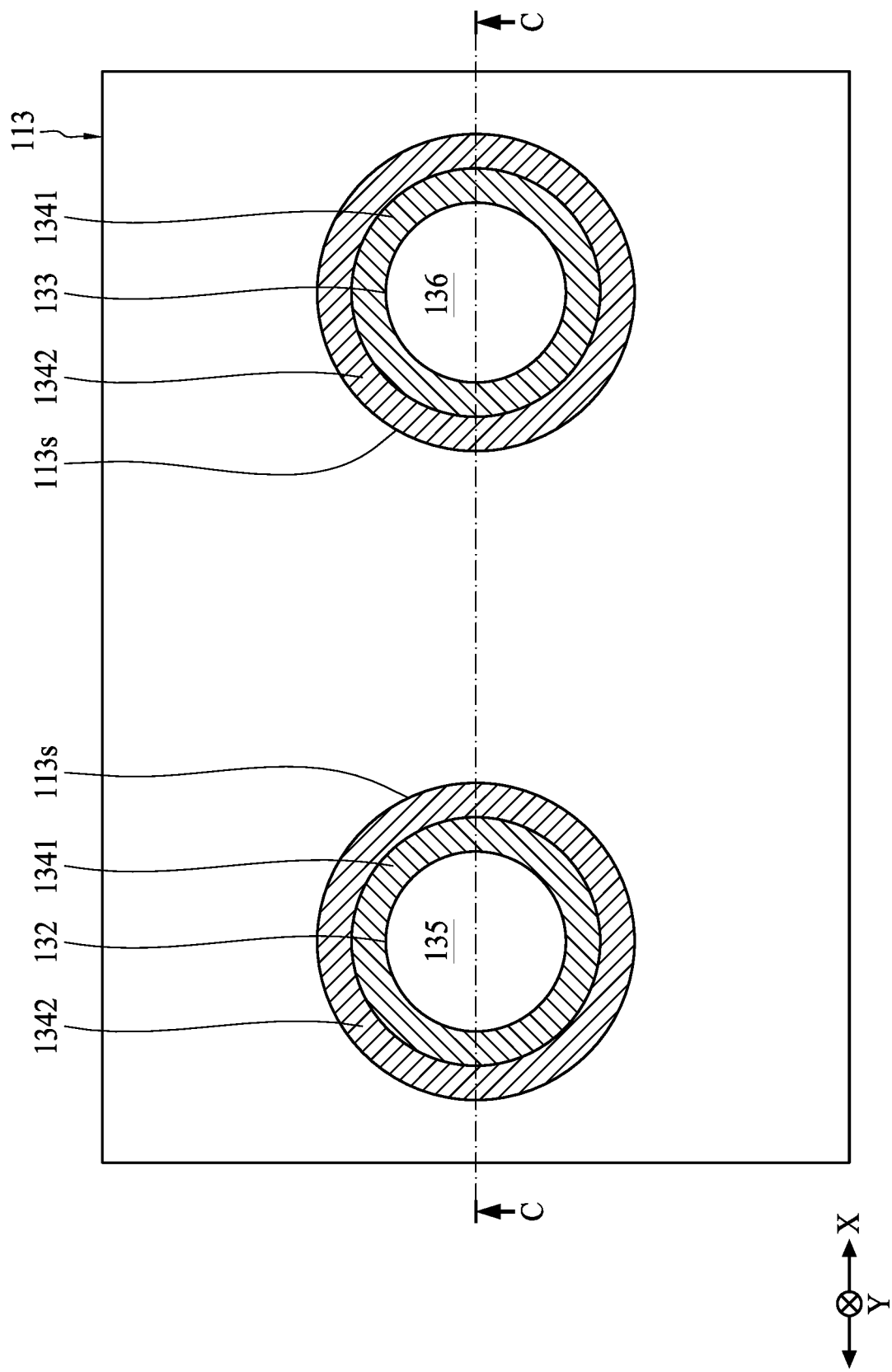
FIG. 8 is a top view of a portion of a semiconductor structure in accordance with some embodiments of the present disclosure.
Figure 9:
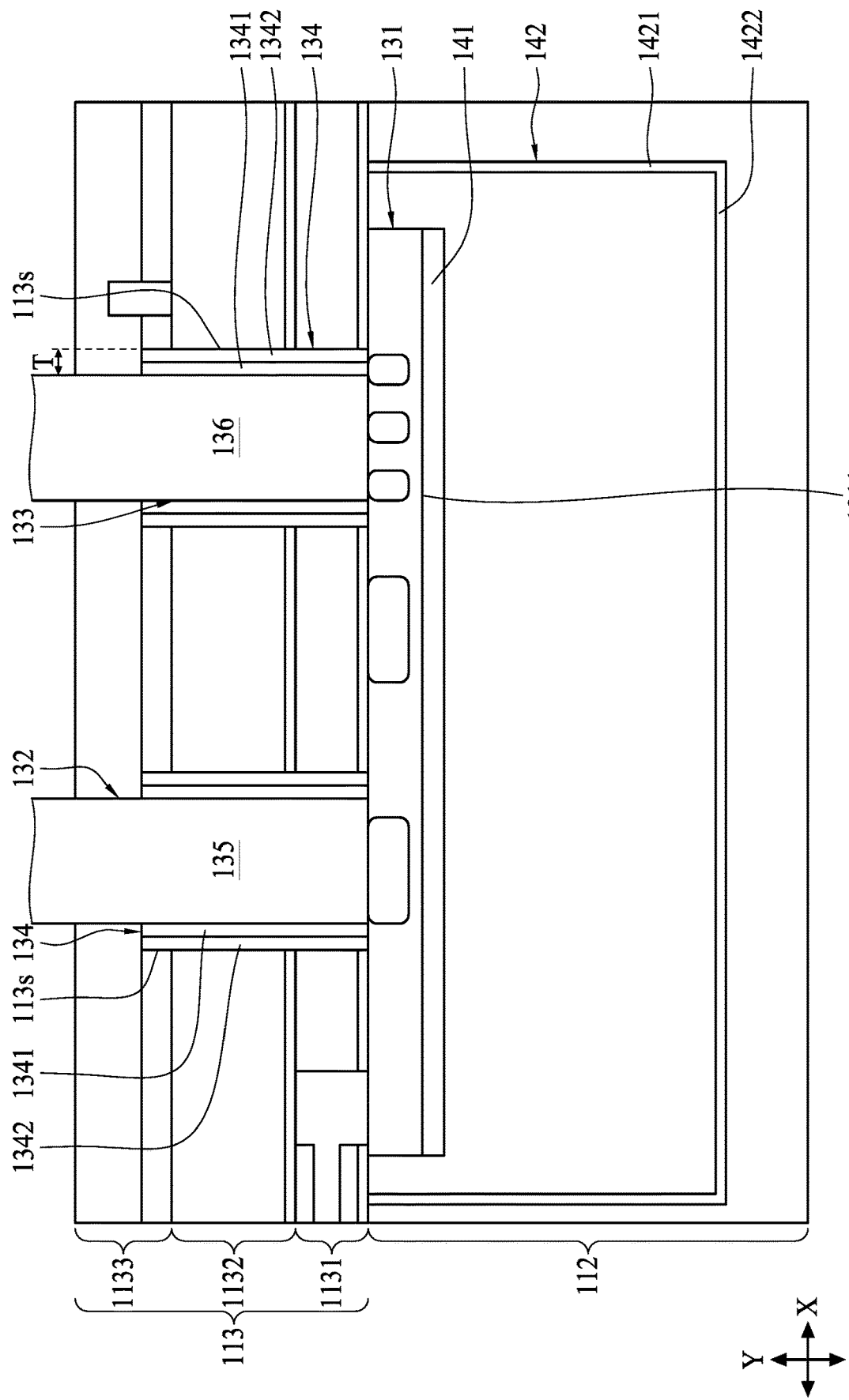
FIG. 9 is an enlarged cross-sectional view of a portion of a semiconductor structure in accordance with some embodiments of the present disclosure.

FIG. 8 is a top view of a portion of a semiconductor structure 10 or a semiconductor structure 20 in accordance with some embodiments of the present disclosure. FIG. 9 is a cross-sectional view taken along line C-C of FIG. 8 of the semiconductor structure 10 or a semiconductor structure 20 in accordance with some embodiments of the present disclosure.

In some embodiments, as shown in FIGS. 8 and 9, the dielectric liner 134 includes a plurality of sub-liners. Each sub-liners of the dielectric liner 134 may include different dielectric material and have different thickness according to the actual needs. In some embodiments, the dielectric liner 134 includes a first sub-liner 1341 surrounds the first opening 132 or the second opening 133, and a second sub-layer 1342 surrounds the first sub-layer 1341. In some embodiments, the shape and thickness of each of the first sub-liner 1341 and the second sub-liner 1342 from the top view are not particularly limited, and may be adjusted according to the actual needs. Further, each of the first sub-liner 1341 and the second sub-liner 1342 may include similar or different dielectric materials.

FIGS. 8 and 9 illustrate only two sub-liners for clarity and simplicity, but such example is intended to be illustrative only, and is not intended to be limiting to the embodiments. A person ordinarily skilled in the art would readily understand that any suitable number of the sub-liners may alternatively be utilized, and all such combinations are fully intended to be included within the scope of the embodiments.

In some embodiments, the first sub-liner 1341 and the second sub-layer 1342 are attached to the photoelectric device 131. In some embodiments, the first sub-liner 1341 and the second sub-layer 1342 extend along the Y direction, respectively. In some embodiments, the first sub-liner 1341 is disposed along the sidewall 132s of the first opening 132, and the second sub-layer 1342 is sandwiched between the first sub-liner 1341 and the RDL 113. The second sub-liner 1342 may be conformal to the first sub-liner 1341. In some embodiments, the first sub-liner 1341 is attached to the second sub-layer 1342 as shown in FIGS. 8 and 9. In some embodiments, the first sub-liner 1341 and the second sub-layer 1342 are isolated from each other, and a portion of the RDL 113 is disposed between the first sub-liner 1341 and the second sub-layer 1342. In some embodiments, the passivation layers 1133 are disposed on the first sub-liner 1341 and the second sub-layer 1342.

In some embodiments, the inner periphery of the first sub-liner 1341 is the sidewall 132*s* of the first opening 132. In some embodiments, the outer periphery of the second sub-layer 1342 is in contact with the sidewall 113*s* of the RDL 113.

Figure 10:
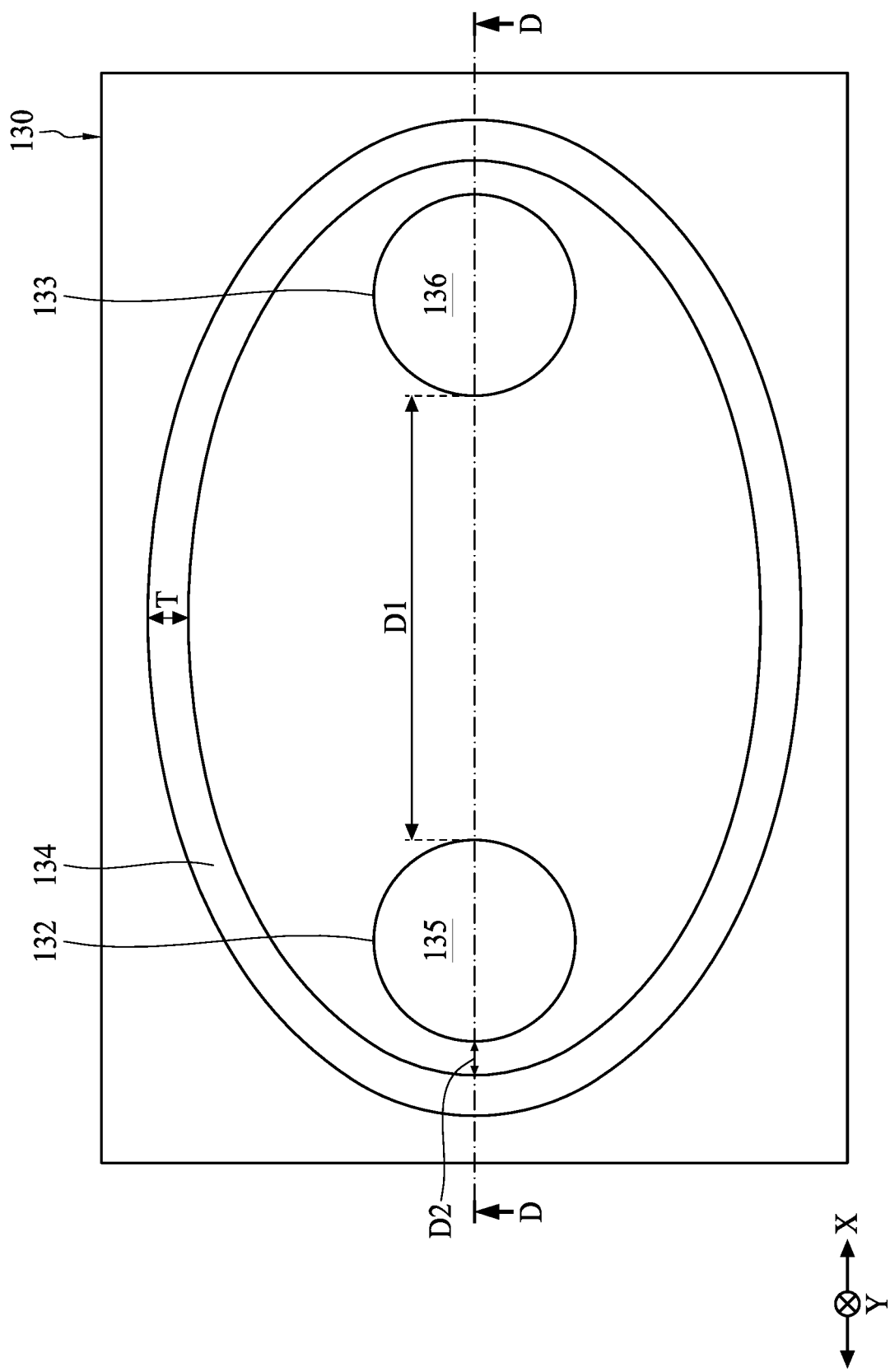
FIG. 10 is a top view of a portion of a semiconductor structure in accordance with some embodiments of the present disclosure.
Figure 11:
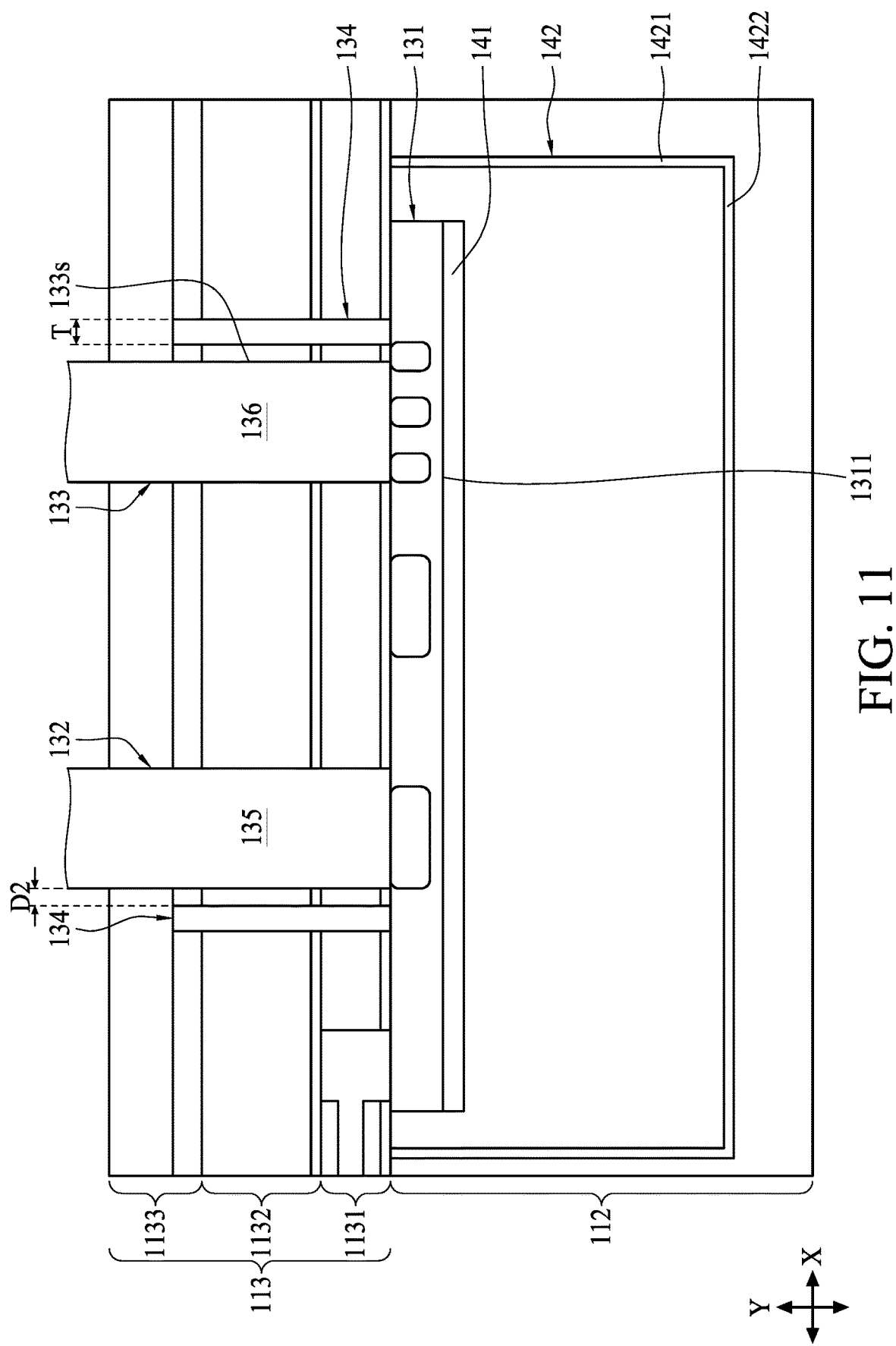
FIG. 11 is an enlarged cross-sectional view of a portion of a semiconductor structure in accordance with some embodiments of the present disclosure.

FIG. 10 is a top view of a portion of a semiconductor structure 10 or a semiconductor structure 20 in accordance with some embodiments of the present disclosure. FIG. 11 is a cross-sectional view taken along line D-D of FIG. 10 of the semiconductor structure 10 or a semiconductor structure 20 in accordance with some embodiments of the present disclosure.

In some embodiments, the RDL 113 surrounds the dielectric liner 134. In some embodiments, a distance D2 between the first opening 132 and the dielectric liner 134 is substantially greater than 0. In some embodiments, the distance D2 is substantially greater than 75 nm.

Figure 12:
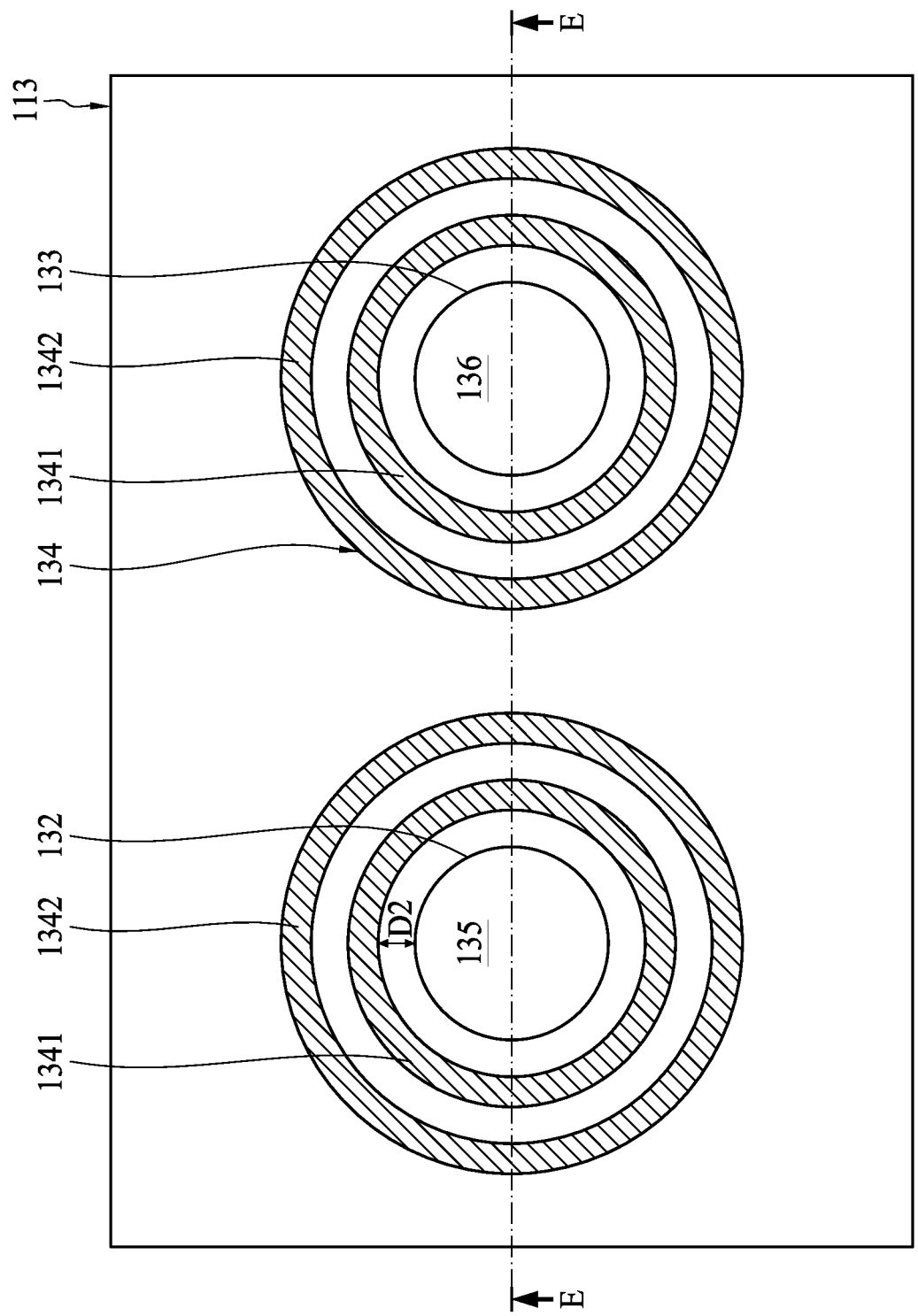
FIG. 12 is a top view of a portion of a semiconductor structure in accordance with some embodiments of the present disclosure.
Figure 13:
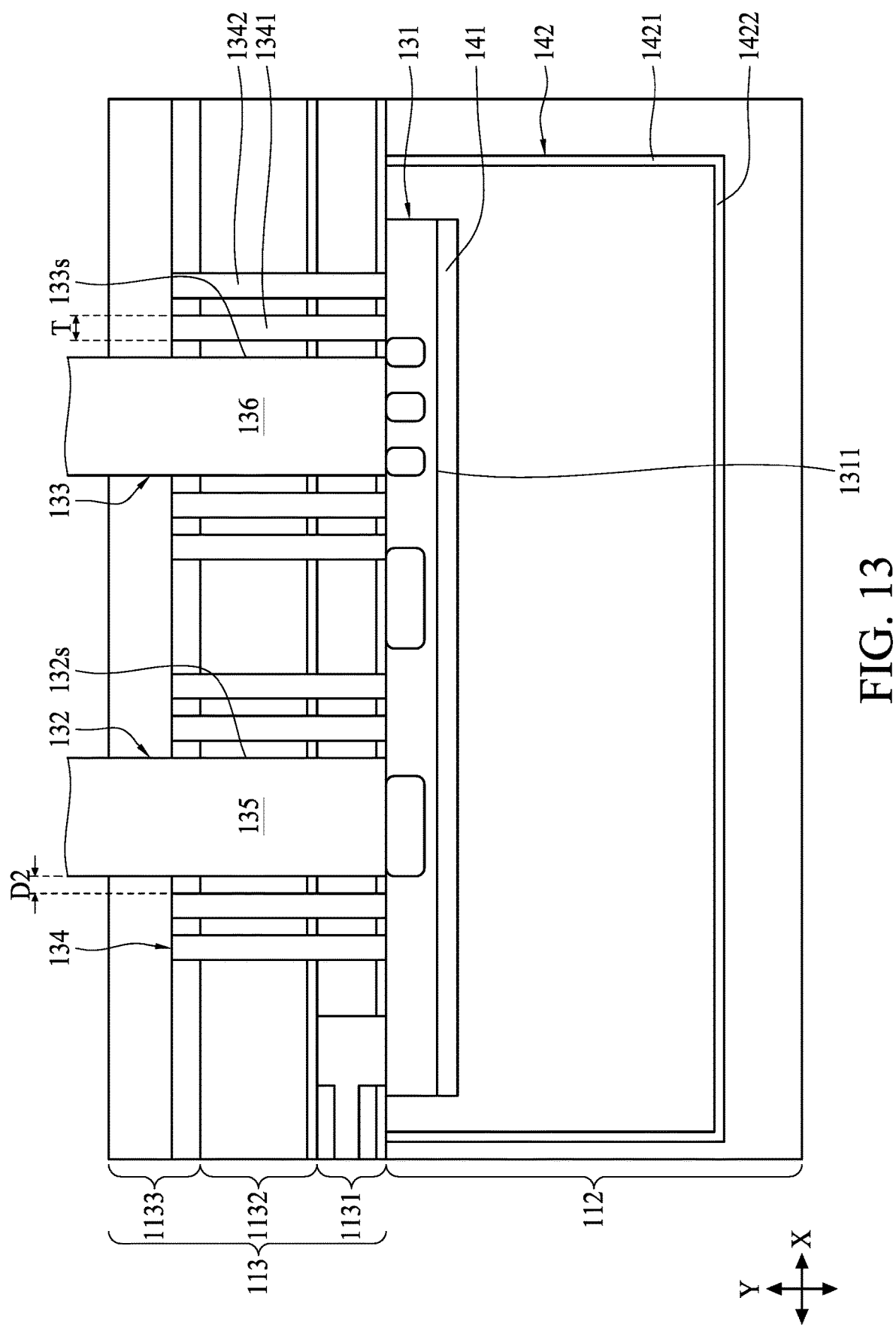
FIG. 13 is an enlarged cross-sectional view of a portion of a semiconductor structure in accordance with some embodiments of the present disclosure.
Figure 14:
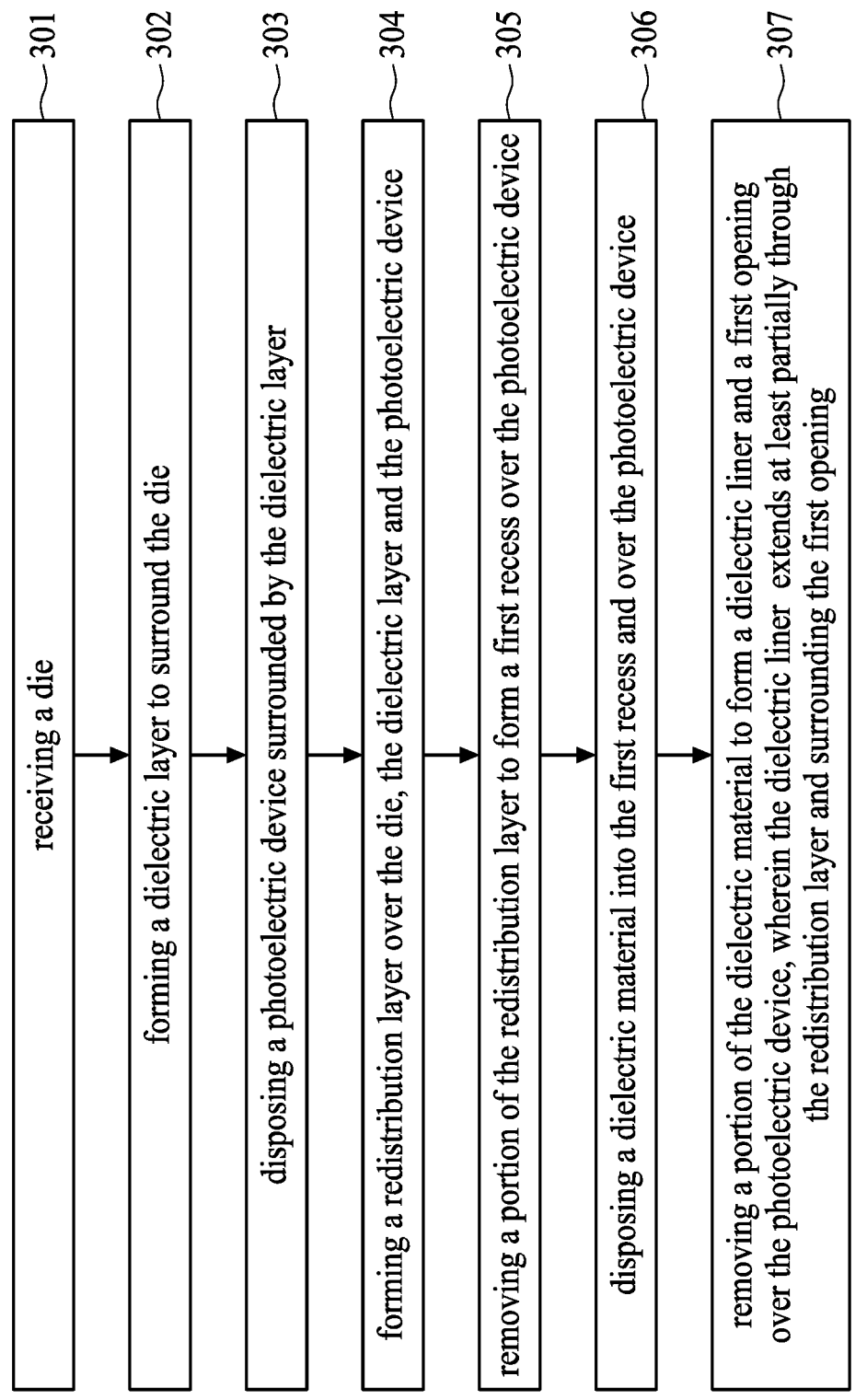
FIGS. 14 and 15 are flowcharts of a method for forming a semiconductor structure in accordance with some embodiments of the present disclosure.
Figure 15:
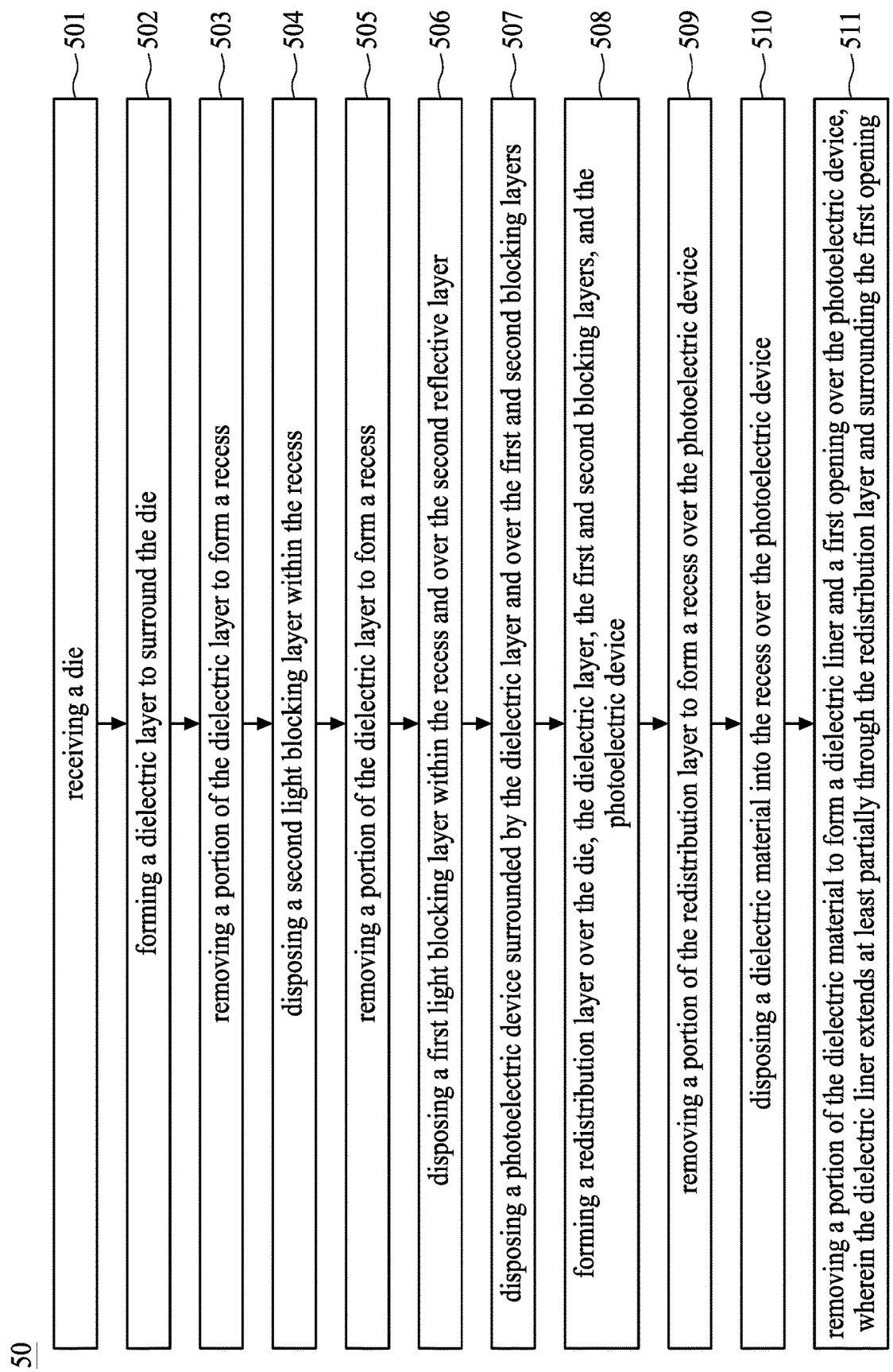

FIG. 12 is a top view of a portion of a semiconductor structure 10 or a semiconductor structure 20 in accordance with some embodiments of the present disclosure. FIG. 13 is a cross-sectional view taken along line E-E of FIG. 10 of the semiconductor structure 10 or a semiconductor structure 20 in accordance with some embodiments of the present disclosure.

In some embodiments, as shown in FIGS. 12 and 13, the first sub-liner 1341 and the second sub-layer 1342 are isolated from each other. In some embodiments, the RDL 113 surrounds the first sub-liner 1341 and the second sub-liner 1342, respectively. A portion of the RDL 113 is disposed between the first sub-liner 1341 and the second sub-layer 1342, and another portion of the RDL 113 is disposed between the first sub-liner 1341 and the first opening 132. The first sub-liner 1341 is distanced from the first opening 132. In some embodiments, portions of the IMD layers 1131, 1132 of the RDL 113 are disposed between the first sub-liner 1341 and the second sub-layer 1342.

Referring back to FIGS. 1, 2 and 4, in some embodiments, the semiconductor structure 10 or semiconductor structure 20 further includes a first light blocking layer 141 disposed between the photoelectric device 131 and the dielectric layer 112. The first light blocking layer 141 is configured to reflect or absorb the light to the photoelectric device 131. The first light blocking layer 141 may reduce optical loss and increase the amount of light collected by the photoelectric device 131. In some embodiments, the dielectric layer 112 surrounds the first light blocking layer 141. In some embodiments, the dielectric sub-layer 1123 surrounds the first light blocking layer 141. In some embodiments, the photoelectric device 131 is in contact with the first light blocking layer 141. In some embodiments, the first light blocking layer 141 extends along a bottom surface 1311 of the photoelectric device 131. In some embodiments, the first light blocking layer 141 is attached to a portion of the bottom surface 1311 of the photoelectric device 131. In some embodiments, the first light blocking layer 141 is attached to the entire bottom surface 1311 of the photoelectric device 131.

The first light blocking layer 141 includes dielectric material or metallic material. In some embodiments, the first light blocking layer 141 includes metallic material such as Cu, TiN, TaN, W, alloy, or a combination thereof. In some embodiments, the first light blocking layer 141 includes dielectric material such as SiC, SiN, $SiO_2$, $Al_2O_3$, or a combination thereof. In some embodiments, the dielectric liner 134 and the first light blocking layer 141 include the same material.

In some embodiments, the semiconductor structure 10 further includes a second light blocking layer 142 disposed within the dielectric layer 112 and surrounding the photoelectric device 113. In some embodiments, the second light blocking layer 142 surrounds the first light blocking layer 141. The second light blocking layer 142 is configured to reflect or absorb the light to the photoelectric device 131. The second light blocking layer 142 may reduce optical loss and increase the amount of light collected by the photoelectric device 131.

In some embodiments, the second light blocking layer 142 is spaced apart from the photoelectric device 131. In some embodiments, the photoelectric device 131 and the first light blocking layer 141 are disposed on the second light blocking layer 142. In some embodiments, the dielectric layer 112 surrounds the second light blocking layer 142. In some embodiments, the dielectric sub-layer 1123 surrounds the second light blocking layer 142. In some embodiments, the second light blocking layer 142 includes a first portion 1421 that surrounds the photoelectric device 131 from a top view and a second portion 1422 that overlaps the photoelectric device 131 from a top view. In some embodiments, the first portion 1421 is in contact with the second portion 1422. In some embodiments, the first portion 1421 is adjacent to the second portion 1422.

The second light blocking layer 142 includes dielectric material or metallic material. In some embodiments, the second light blocking layer 142 includes metallic material such as Cu, TiN, TaN, W, alloy, or a combination thereof. In some embodiments, the first light blocking layer 141 includes dielectric material such as SiC, SiN, $SiO_2$, $Al_2O_3$, or a combination thereof. The materials of the first light blocking layer 141, the second light blocking layer 142, and the dielectric liner 134 may be similar or different according to the actual needs.

FIG. 12 is a flowchart of a method 30 for forming a semiconductor structure in accordance with some embodiments of the present disclosure. As illustrated in FIG. 12, the method 30 includes several operations: (301) receiving a die; (302) forming a dielectric layer to surround the die; (303) disposing a photoelectric device surrounded by the dielectric layer; and (304) forming a redistribution layer over the die, the dielectric layer and the photoelectric device. The method 30 further includes (305) removing a portion of the redistribution layer to form a first recess over the photoelectric device; (306) disposing a dielectric material into the first recess over the photoelectric device; (307) removing a portion of the dielectric material to form a dielectric liner and a first opening over the photoelectric device. The dielectric liner extends at least partially through the redistribution layer and surrounding the first opening.

FIG. 13 is a flowchart of a method 50 for forming a semiconductor structure in accordance with some embodiments of the present disclosure. As illustrated in FIG. 13, the method 50 includes several operations: (501) receiving a die; (502) forming a dielectric layer to surround the die; (503) removing a portion of the dielectric layer to form a recess; and (504) disposing a second reflective layer within the recess. The method 50 further includes (505) removing a portion of the dielectric layer to form a recess; (506) disposing a first reflective layer within the recess and over the second reflective layer; (507) disposing a photoelectric device surrounded by the dielectric layer and over the first and second reflective layers; and (508) forming a redistribution layer over the die, the dielectric layer, the first and second reflective layers, and the photoelectric device. The method further includes (509) removing a portion of the redistribution layer to form a recess over the photoelectric device; (510) disposing a dielectric material into the recess over the photoelectric device; and (511) removing a portion of the dielectric material to form a dielectric liner and a first opening over the photoelectric device. The dielectric liner extends at least partially through the redistribution layer and surrounding the first opening.

FIGS. 16 to 28 are schematic cross-sectional views of a semiconductor structure formed using the method 50 in accordance with some embodiments of the present disclosure. In some embodiments, the method 50 is configured to form the semiconductor structure 10 or the semiconductor structure 20 as illustrated in FIGS. 5 and 7.

Figure 16:
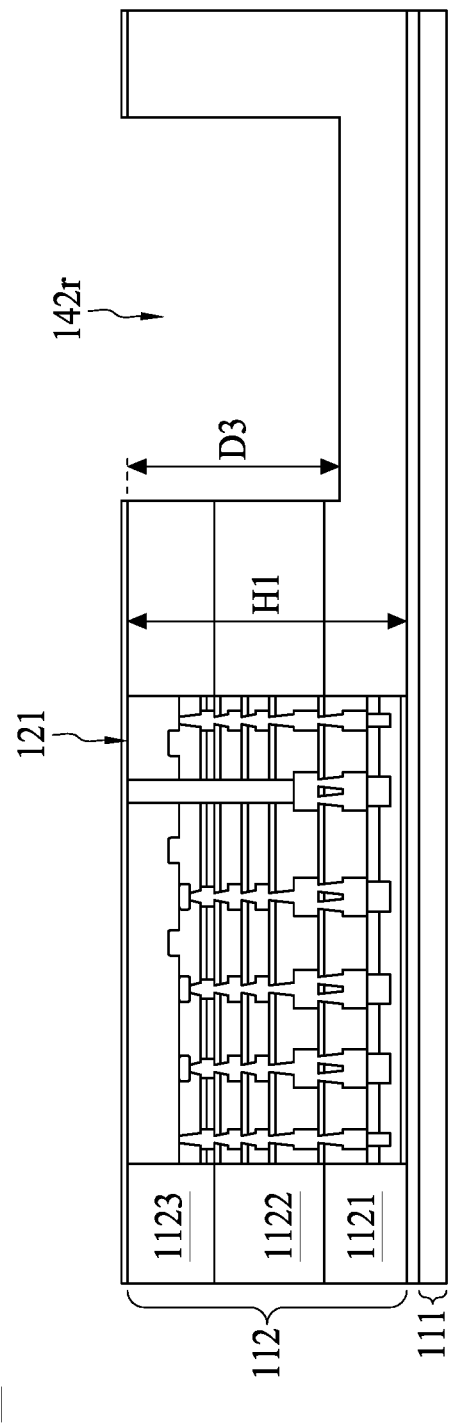
FIGS. 16 to 28 are cross-sectional views of one or more stages of the method for forming a semiconductor structure in accordance with some embodiments of the present disclosure.
Figure 17:
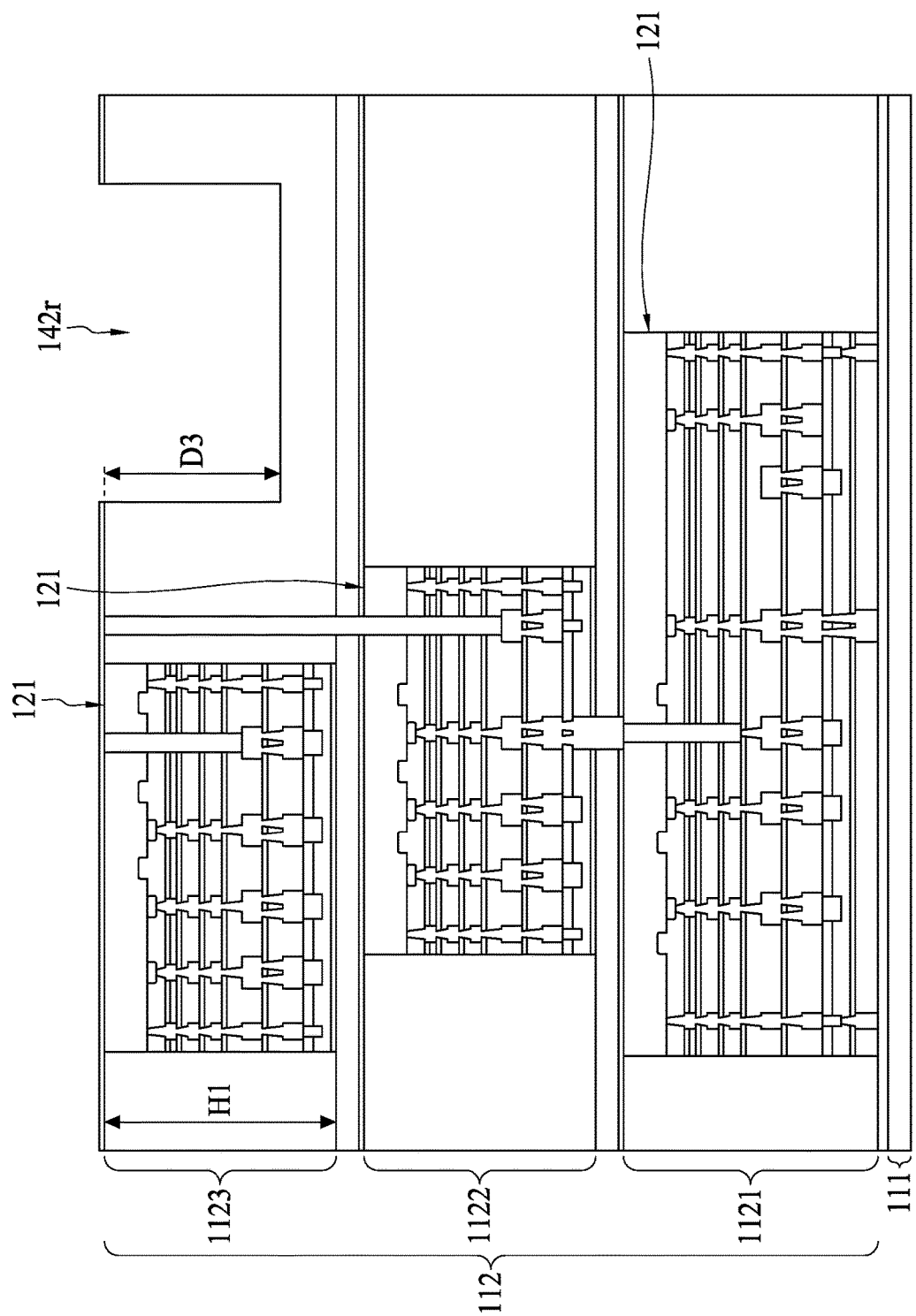

As illustrated in FIG. 16, in operation 501, a die 121 is received, and in operation 502, a dielectric layer 112 surrounding the die 121 is formed. In some embodiments, the die 121 is disposed over a substrate 111. In some embodiments, as illustrated in FIG. 17, a plurality of dies 121 are received and disposed on the substrate 111. In some embodiments, the dies 121 are stacked, and the dielectric layer 112 surrounds the dies 121.

In some embodiments, referring to FIGS. 16 and 17, the dielectric layer 112 is formed by suitable fabrication techniques such as spin coating, chemical vapor deposition (CVD), plasma-enhanced chemical vapor deposition (PECVD), or the like. In some embodiments, the dielectric layer 112 is a single layer or multiple layers stacked over each other. In some embodiments, a plurality of dielectric sub-layers 1121, 1122, 1123 are stacked over each other, and each of the dielectric sub-layers 1121, 1122, 1123 surrounds at least one die 121. In some embodiments, the dies 121 overlap each other from a top view. In some embodiments, the method 50 further includes electrically connecting at least one die 121 to another die 121 through a via 122.

In operation 503, a portion of the dielectric layer 112 is removed to form a recess 142r as shown in FIGS. 16 and 17. The portion of the dielectric layer 112 may be removed by a stripping process and/or an etching process. In some embodiments, the recess 142r is formed adjacent to the die 121. In some embodiments, a portion of the dielectric sub-layer 1123 is removed to form the recess 142r. In some embodiments, the recess 142r is formed to have a depth D3 similar to or less than a height H1 of the dielectric sub-layer 1123.

Figure 18:
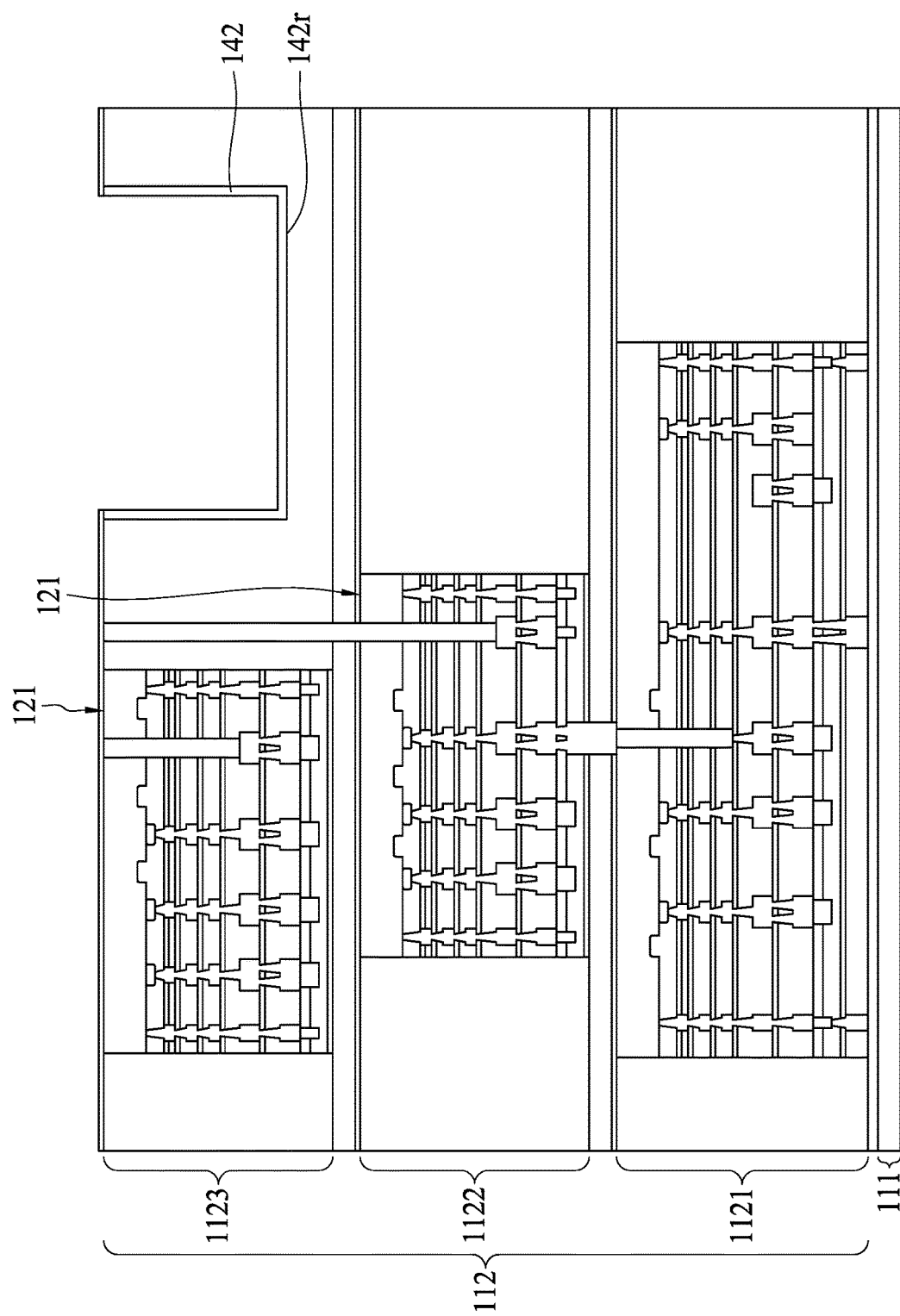

As illustrated in FIG. 18, in operation 504, a second light blocking layer 142 is disposed within the recess 142r. In some embodiments, the second light blocking layer 142 is conformal to the recess 142r. In some embodiments, the second light blocking layer 142 includes metallic material, wherein a layer of metallic material is deposited over the inner periphery of the recess 142r by plating, such as electroplating or electro-less plating.

In some embodiments, the second light blocking layer 142 includes a dielectric material. In some embodiments, a first dielectric paste is deposited into the recess 142r and applied over the die 121 and the dielectric sub-layer 1123. In some embodiments, the first dielectric paste is in a liquid state at room temperature. In some embodiments, the first dielectric paste is a slurry paste. In some embodiments, the first dielectric paste includes a solvent to enhance the coating fluidity. In some embodiments, a portion of the first dielectric paste is removed until the die 121 and the dielectric sub-layer 1123 are exposed, while a layer of the first dielectric paste remains in the recess 142r. In some embodiments, after the portion of the first dielectric paste is removed, a curing process or hardening process is performed to evaporate the solvent. For example, in some embodiments, the first dielectric paste is cured by a soft-baking process. After the first dielectric paste disposed in the recess 142r is cured, a second light blocking layer 142 conformal to the recess 142r is formed.

Figure 19:
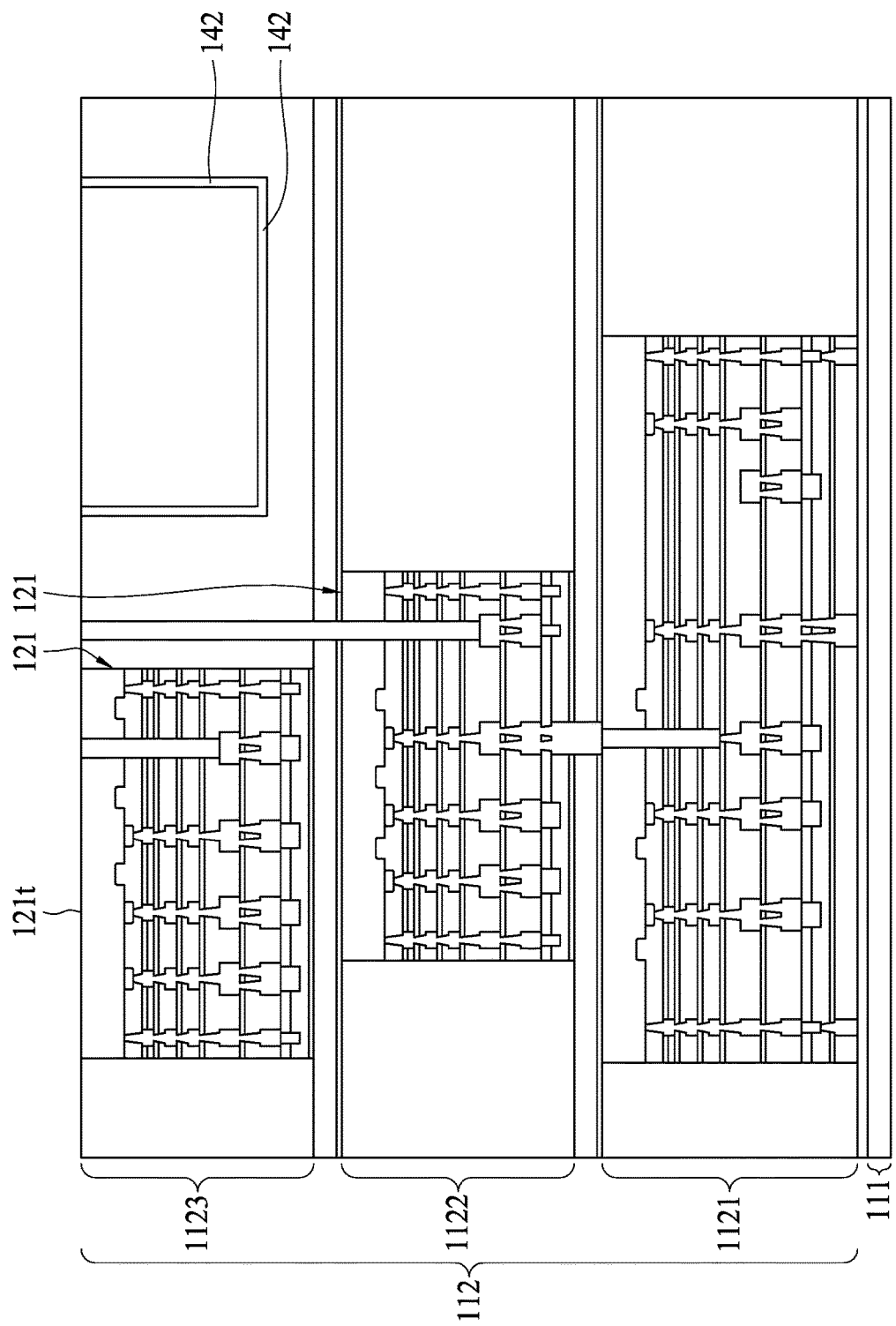

As illustrated in FIG. 19, in some embodiments, after the second light blocking layer 142 is formed, a second dielectric paste is applied over the second light blocking layer 142, the dielectric layer 112 and the die 121. When the second light blocking layer 142 includes a dielectric material, the dielectric material included in the second dielectric paste is different from the dielectric material included in the first dielectric paste. In some embodiments, dielectric material included in the second dielectric paste is similar to the dielectric material of the dielectric layer 112 surrounding the die 121. In some embodiments, the second dielectric paste is in a liquid state at room temperature. In some embodiments, the second dielectric paste is a slurry paste. In some embodiments, the second dielectric paste includes a solvent to enhance the coating fluidity.

In some embodiments, a portion of the second dielectric paste is removed to expose a portion of the die 121. In some embodiments, a portion of the second dielectric paste is removed until the top surface of the second dielectric paste and the dielectric sub-layer 1123 are substantially level (coplanar) along the top surface 121t of the die 121. In some embodiments, the portion of the second dielectric paste is removed by a scraper. In some embodiments, after the portion of the second dielectric paste is removed, a curing process or hardening process is performed to evaporate the solvent.

Figure 20:
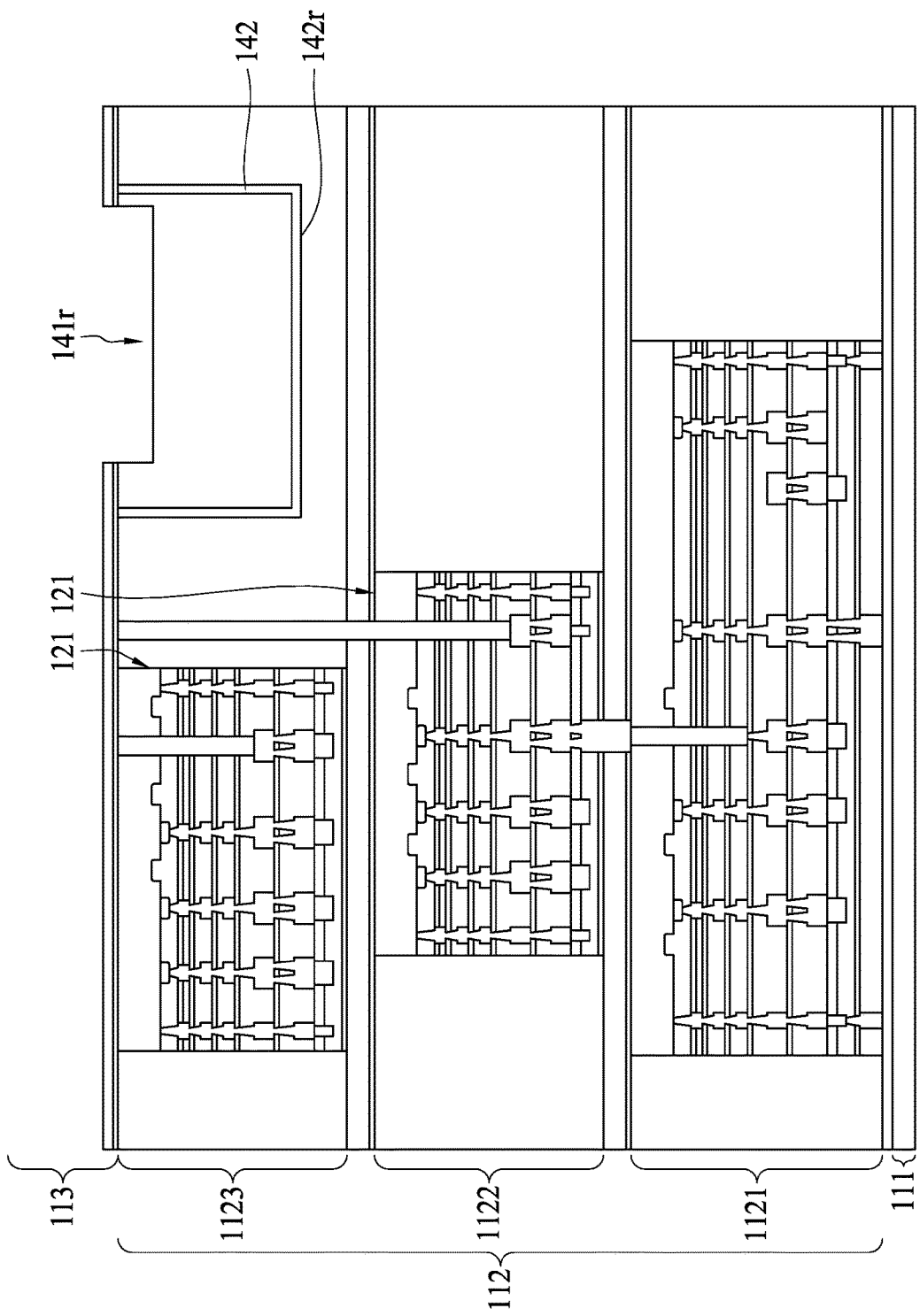

As illustrated in FIG. 20, in operation 505, in some embodiments, a portion of the dielectric layer is removed to form a recess 141r. In some embodiments, after the second dielectric paste disposed on the second light blocking layer 142 is cured, the recess 141r is formed in the dielectric layer 112, wherein the recess 141r is surrounded by the second light blocking layer 142. In some embodiments, the recess 141r is formed by removing a portion of the dielectric sub-layer 1123 disposed in the second light blocking layer 142. The portion of the dielectric sub-layer 1123 may be removed by a stripping process and/or an etching process. In some embodiments, the recess 141r is surrounded by the second light blocking layer 142 and the dielectric sub-layer 1123.

Figure 21:
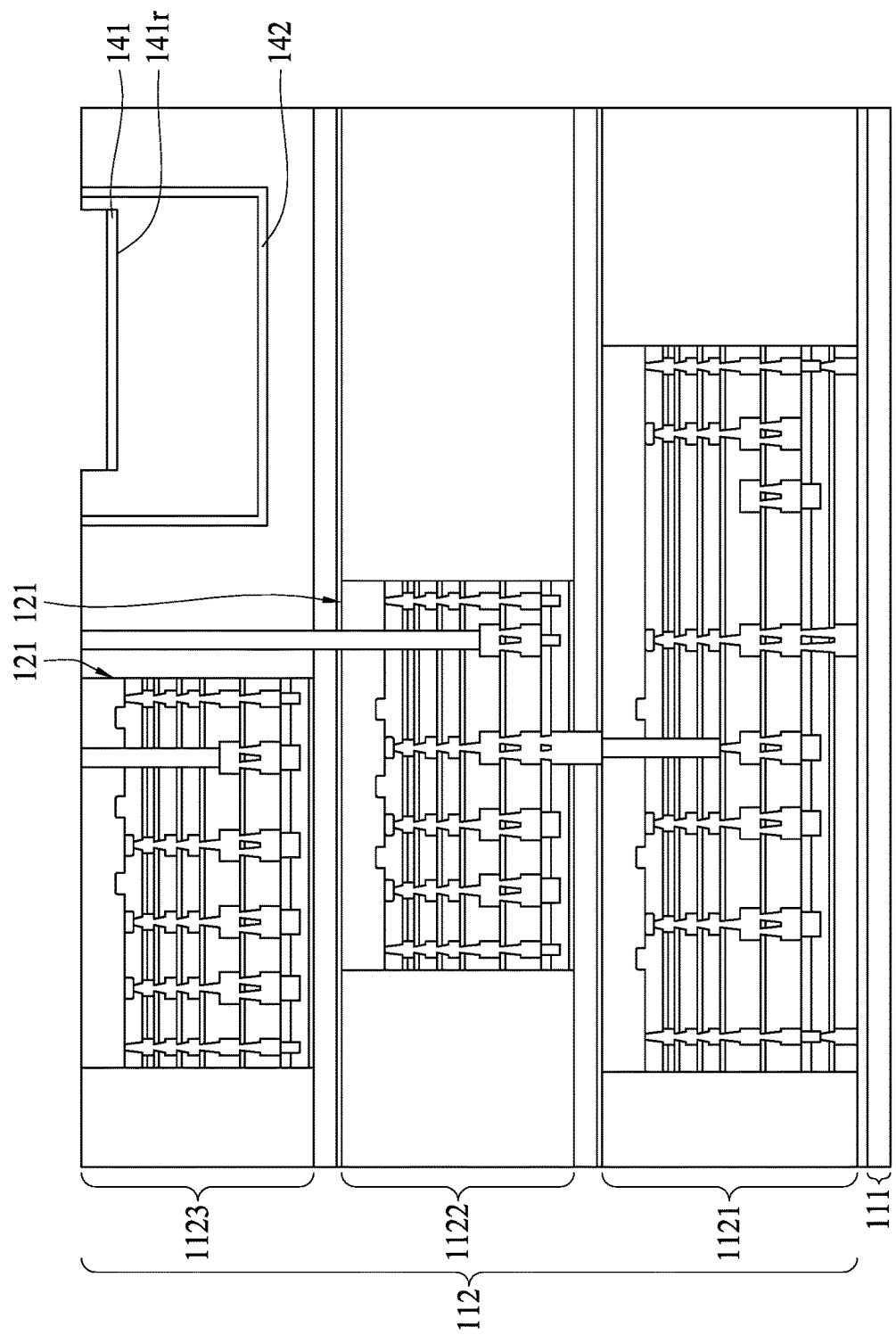

As illustrated in FIG. 21, in operation 506, in some embodiments, a first light blocking layer 141 is disposed within the recess 141r and over the second light blocking layer 142. In some embodiments, the first light blocking layer 141 is conformal to the recess 141r. In some embodiments, the first light blocking layer 141 covers the bottom surface of the recess 141r. In some embodiments, the first light blocking layer 141 includes metallic material, wherein a layer of metallic material is deposited over the inner periphery of the recess 141r by plating, such as electroplating or electro-less plating.

In some embodiments, the first light blocking layer 141 includes a dielectric material. In some embodiments, a dielectric material for the first light blocking layer 141 is deposited by plasma enhanced chemical vapor deposition (PECVD).

In some embodiments, a third dielectric paste is deposited into the recess 142r and applied over the die 121 and the dielectric sub-layer 1123. In some embodiments, the third dielectric paste is in a liquid state at room temperature. In some embodiments, the third dielectric paste is a slurry paste. In some embodiments, the third dielectric paste includes a solvent to enhance the coating fluidity. In some embodiments, a portion of the third dielectric paste is removed until the die 121 and the dielectric sub-layer 1123 are exposed, while a layer of the third dielectric paste remains in the recess 141r. In some embodiments, after the portion of the third dielectric paste is removed, a curing process or hardening process is performed to evaporate the solvent. For example, in some embodiments, a soft-baking process cures the third dielectric paste. After the third dielectric paste disposed in the recess 141r is cured, a first light blocking layer 141 conformal to the recess 141r is formed. In some embodiments, the third dielectric paste is similar to the first dielectric paste.

Figure 22:
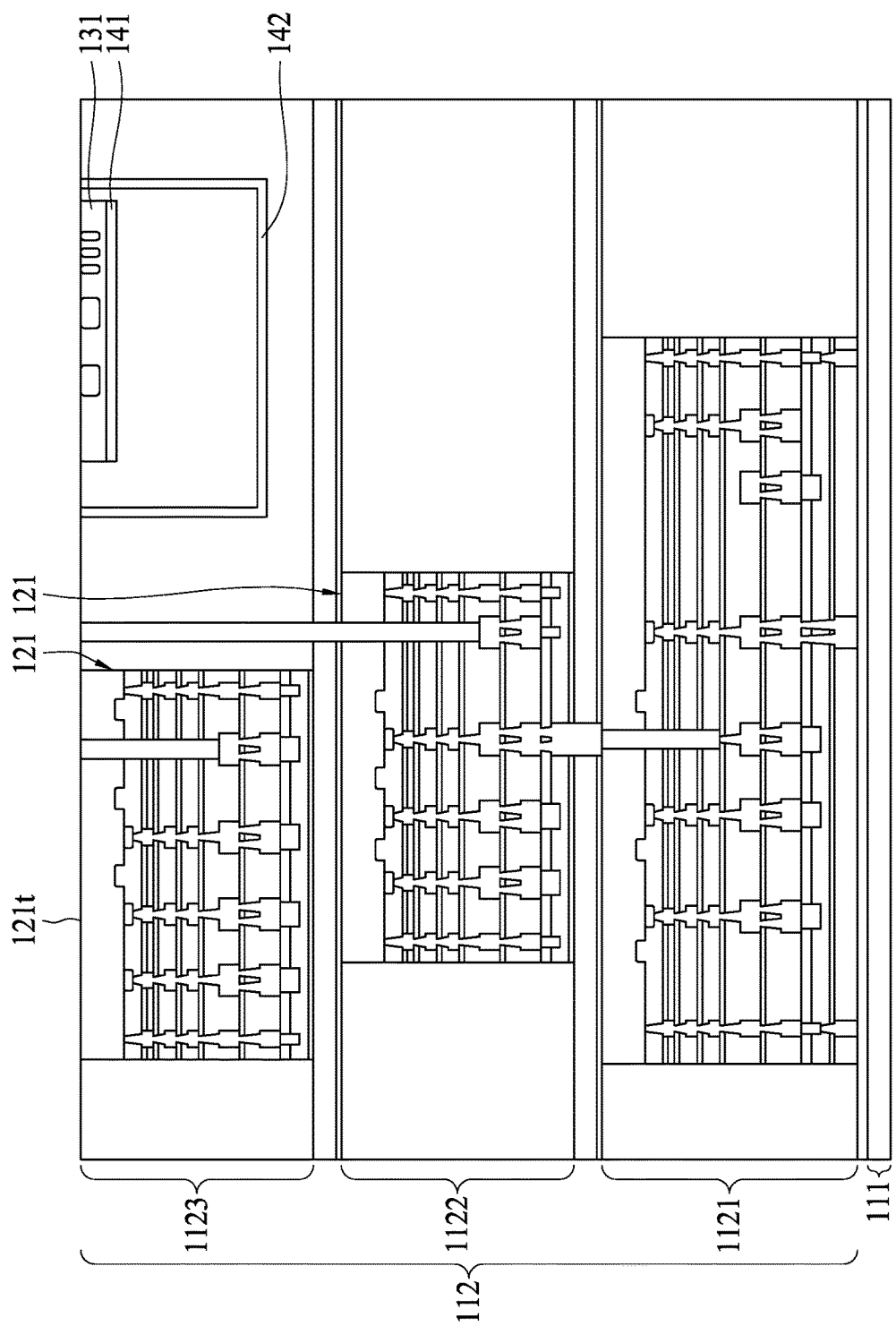

As illustrated in FIG. 22, in operation 507, in some embodiments, a photoelectric device 131 is disposed over the first and second reflective layers 141, 142 and surrounded by the dielectric layer 112. In some embodiments, the photoelectric device 131 is disposed adjacent to the die 121. In some embodiments, the dielectric sub-layer 1123 surrounds the photoelectric device 131. In some embodiments, the photoelectric device 131 is directly disposed on the first light blocking layer 141 and in contact with the first light blocking layer 141. In some embodiments, top surfaces of the photoelectric device 131 and the dielectric sub-layer 1123 are substantially level (coplanar) with the top surface 121t of the die 121.

Figure 23:
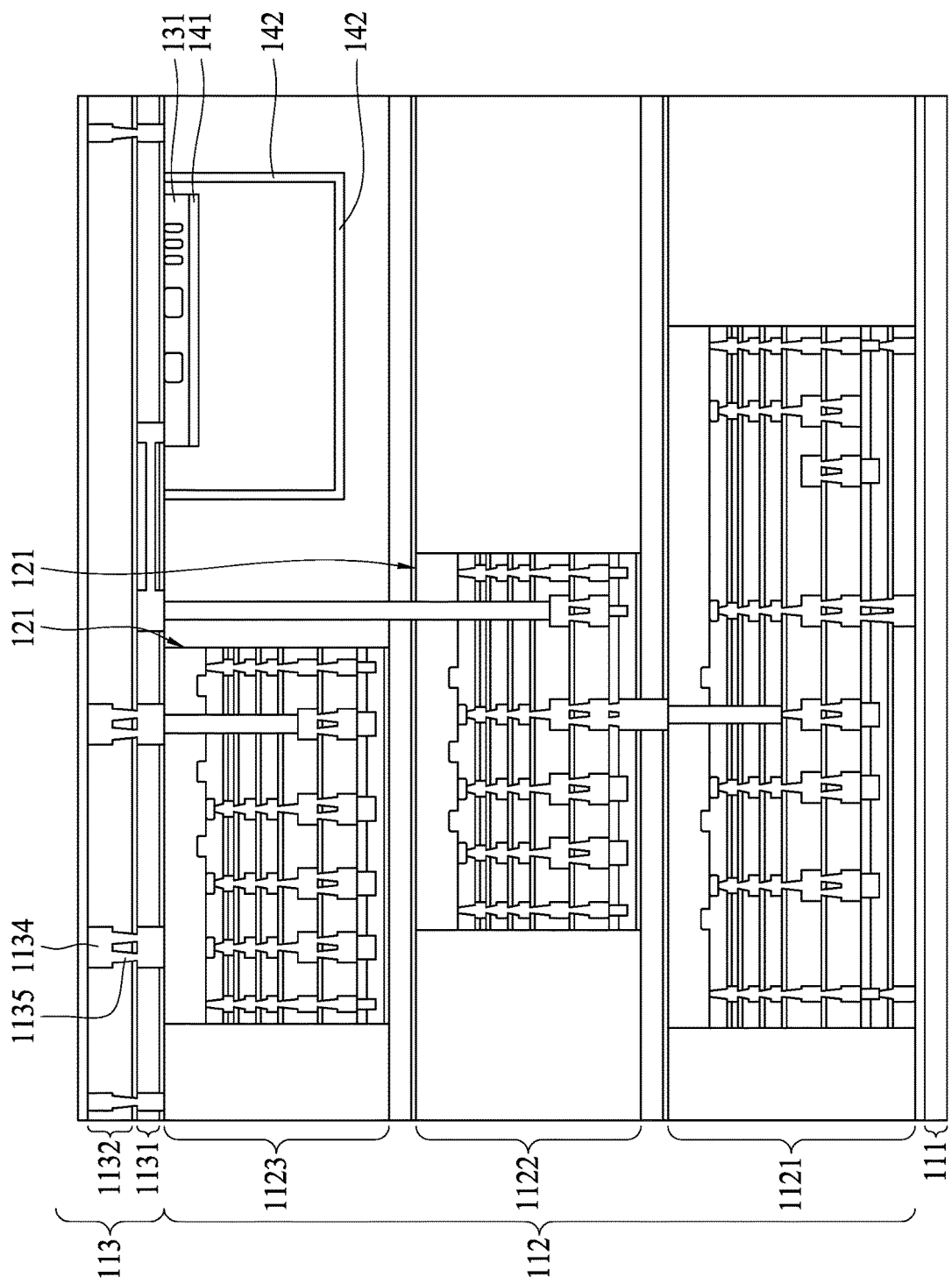

As illustrated in FIG. 23, in operation 508, an RDL 113 is formed over the die 121, the dielectric layer 112, the first and second reflective layers 141, 142, and the photoelectric device 131. In some embodiments, the method 50 further includes electrically connecting the die 121 to the photoelectric device 131 through the RDL 113. In some embodiments, formation of the RDL 113 includes forming IMD layers 1131, 1132, metallization layers 1134, and vias 1135.

In some embodiments, the metallization layers 1134 are formed by depositing the IMD layer 1131, 1132, etching the metallization pattern in the IMD layers 1131, 1132 using, for example, acceptable photolithography techniques, depositing a conductive material for the metallization layers 1134 in the IMD layers 1131, 1132, and removing any excess conductive material by, for example, CMP. The photolithography technique may include a single damascene process or a dual damascene process, particularly when vias 1135 are formed through one of the IMD layers 1131, 1132 to an underlying metallization layer 1134.

Figure 24:
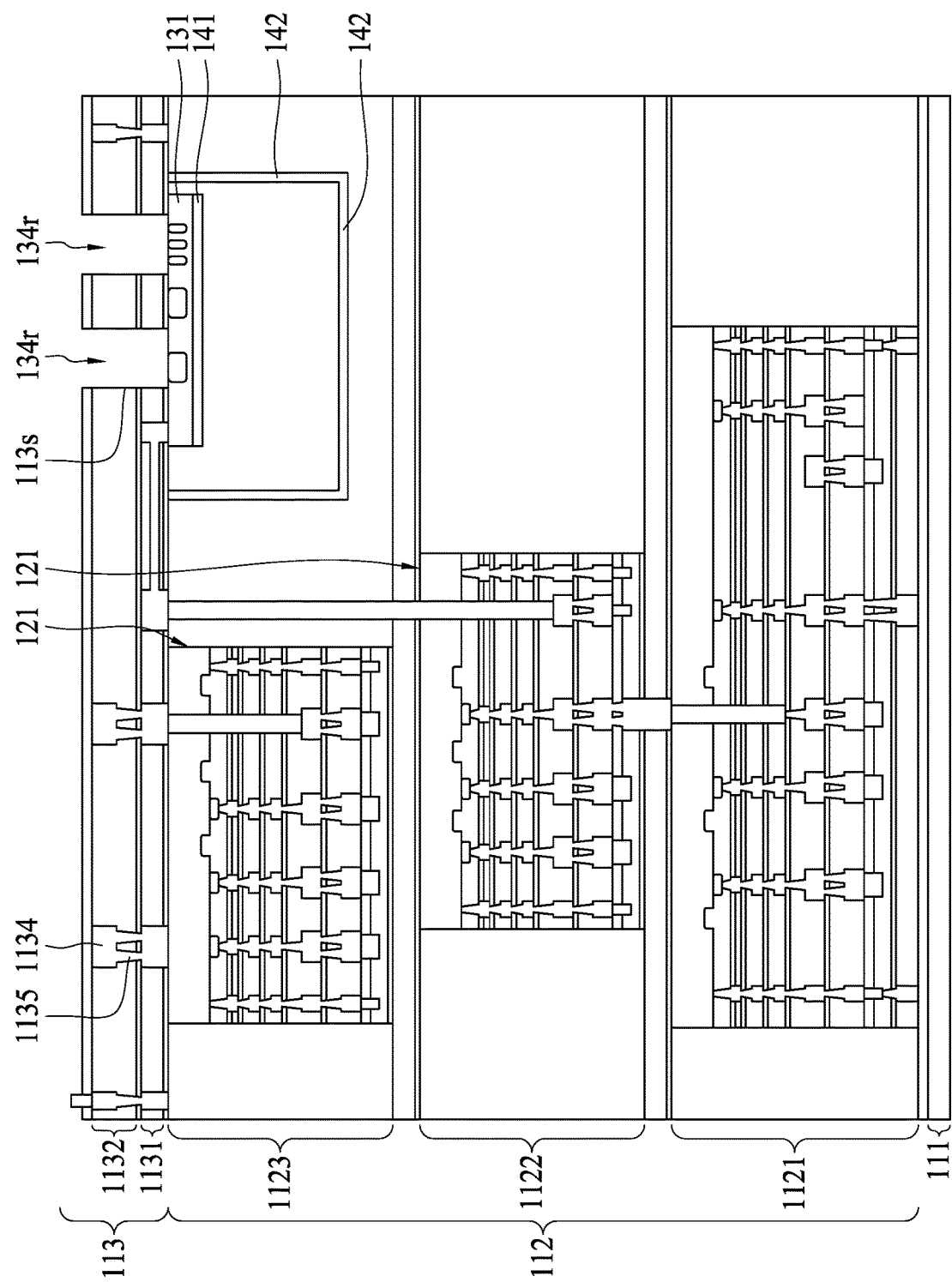

As illustrated in FIG. 24, in operation 509, in some embodiments, a portion of the RDL 113 is removed to form a recess 134r over the photoelectric device 131. The recess 134r may be formed by a stripping process and/or an etching process. In some embodiments, a plurality of recesses 134r is formed over the photoelectric device 131.

In some embodiments, after the IMD layers 1131, 1132, the metallization layers 1134 and the vias 1135 is formed, the recess 134r is formed in the IMD layers 1131, 1132. The recess 141r is surrounded by the IMD layers 1131, 1132 and exposes a portion of the photoelectric device 131. In some embodiments, the recess 134r extends through the RDL 113.

In some embodiments, the recess 134r is formed by removing a portion of the IMD layers 1131, 1132 disposed on the photoelectric device 131.

Figure 25:
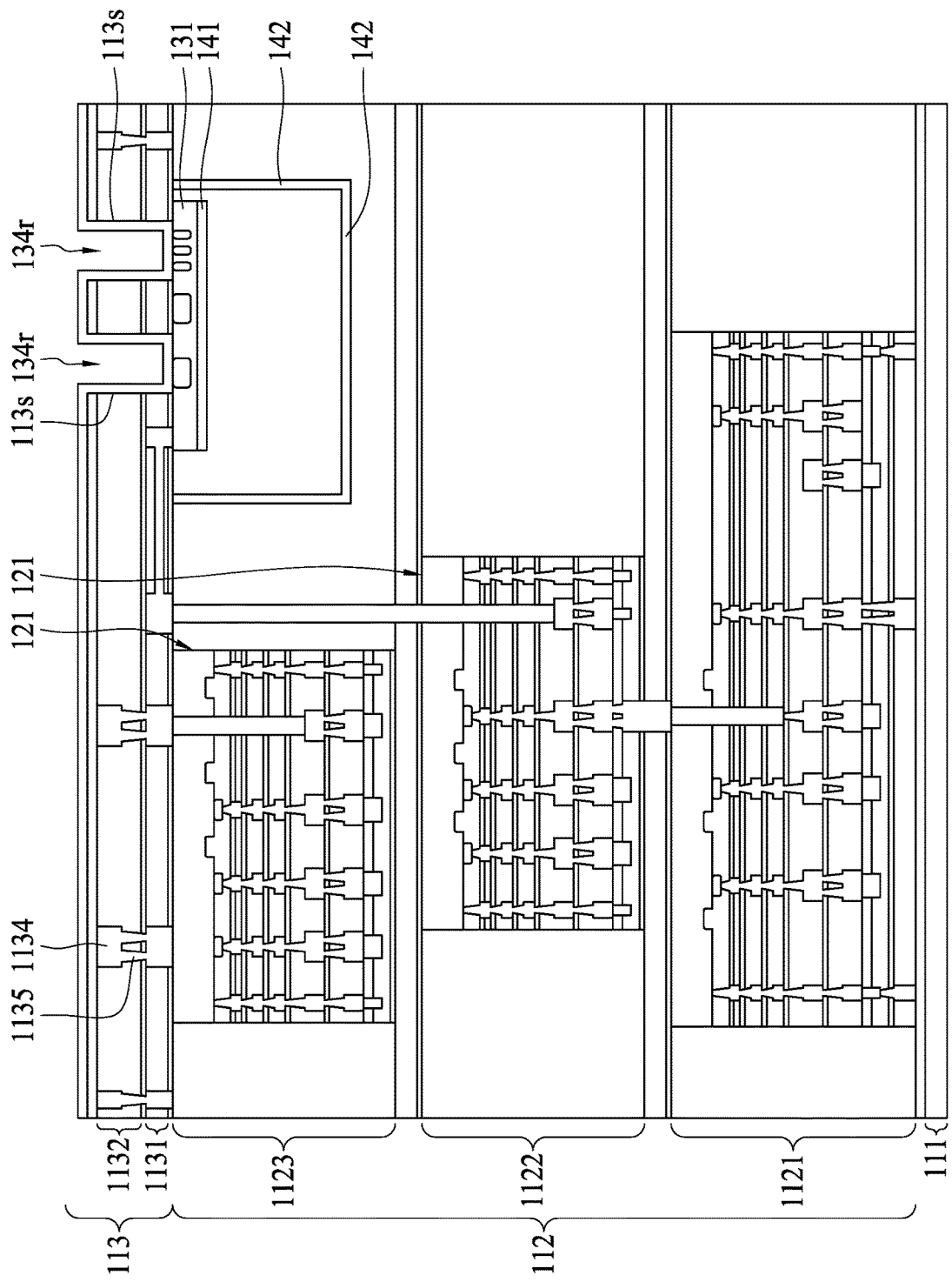

As illustrated in FIG. 25, in operation 510, in some embodiments, a dielectric material is disposed into the recess 134r over the photoelectric device 131. The dielectric material is selected according to the wavelength of the light to be received by the photoelectric device 131. In some embodiments, the dielectric material is disposed into a plurality of the recesses 134r. In some embodiments, the material of the RDL 113 and the dielectric material are different. In some embodiments, the dielectric material is disposed into the recess 134r and applied over the RDL 113. A layer of the dielectric material conformal to the recess 134r is formed. In some embodiments, the dielectric material is deposited by plasma enhanced chemical vapor deposition (PECVD). In some embodiments, the dielectric material is in a liquid state at room temperature. In some embodiments, the dielectric material is a slurry paste. In some embodiments, the dielectric material includes a solvent to enhance the coating fluidity.

Figure 26:
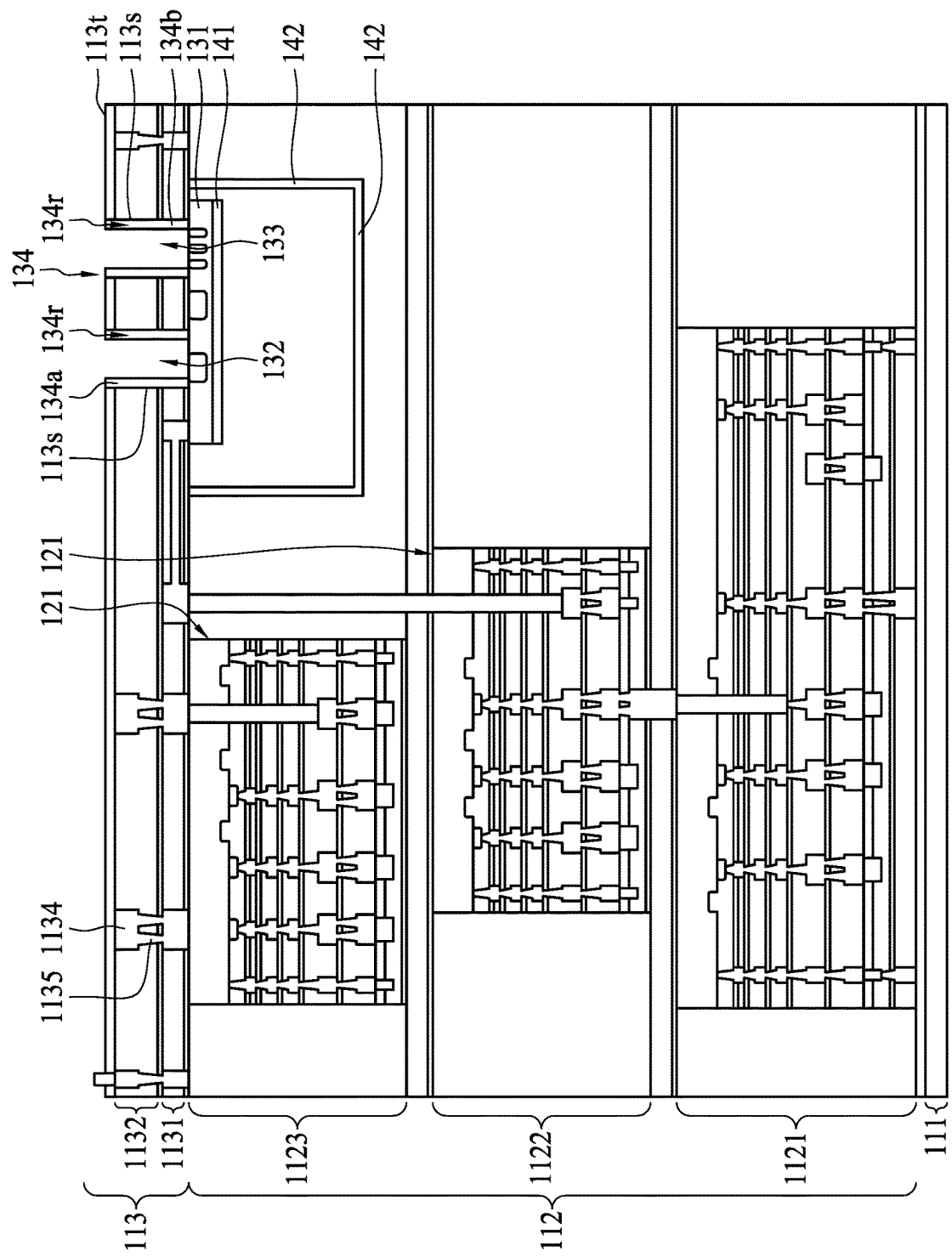

As illustrated in FIG. 26, in operation 511, in some embodiments, a portion of the dielectric material is removed to form a dielectric liner 134 and a first opening 132 over the photoelectric device 131, wherein the dielectric liner 134 extends at least partially through the RDL 113 and surrounding the first opening 132. In some embodiments, a portion of the dielectric material is removed to form a first liner portion 134a, a second liner portion 134b and first and second openings 132, 133 over the photoelectric device 131. In some embodiments, one or more portion of the photoelectric device 131 are exposed through the first and second openings 132, 133 after removing the portion of the dielectric material.

To allow the first opening 132 to expose the photoelectric device 131, a bottom portion of the dielectric material is removed. In some embodiments, an anisotropic dielectric etching process can be used to remove the dielectric material at the bottom of the recess 134r. In some embodiments, a portion of the dielectric material is removed until a top surface 113t of the RDL 113 and a portion of the photoelectric device 131 are exposed, while a layer of the dielectric material remains in the recess 134r and disposed on a sidewall 113s of the RDL 113.

In some embodiments, after the portion of the dielectric material is removed, a curing process or hardening process is performed to evaporate the solvent. For example, in some embodiments, the dielectric material is cured by a soft-baking process. After the dielectric material disposed in the recess 134r is cured, the dielectric liner 134 conformal to the sidewall 113s of the RDL 113 is formed.

In some embodiments, an alternative method of forming the dielectric liner 134 to cover only the sidewall 113r of the RDL 113 involves using patterned photoresist layers to create the recess 134r and to remove the dielectric material at the bottoms of the recess 134r to expose the photoelectric device 131.

Figure 27:
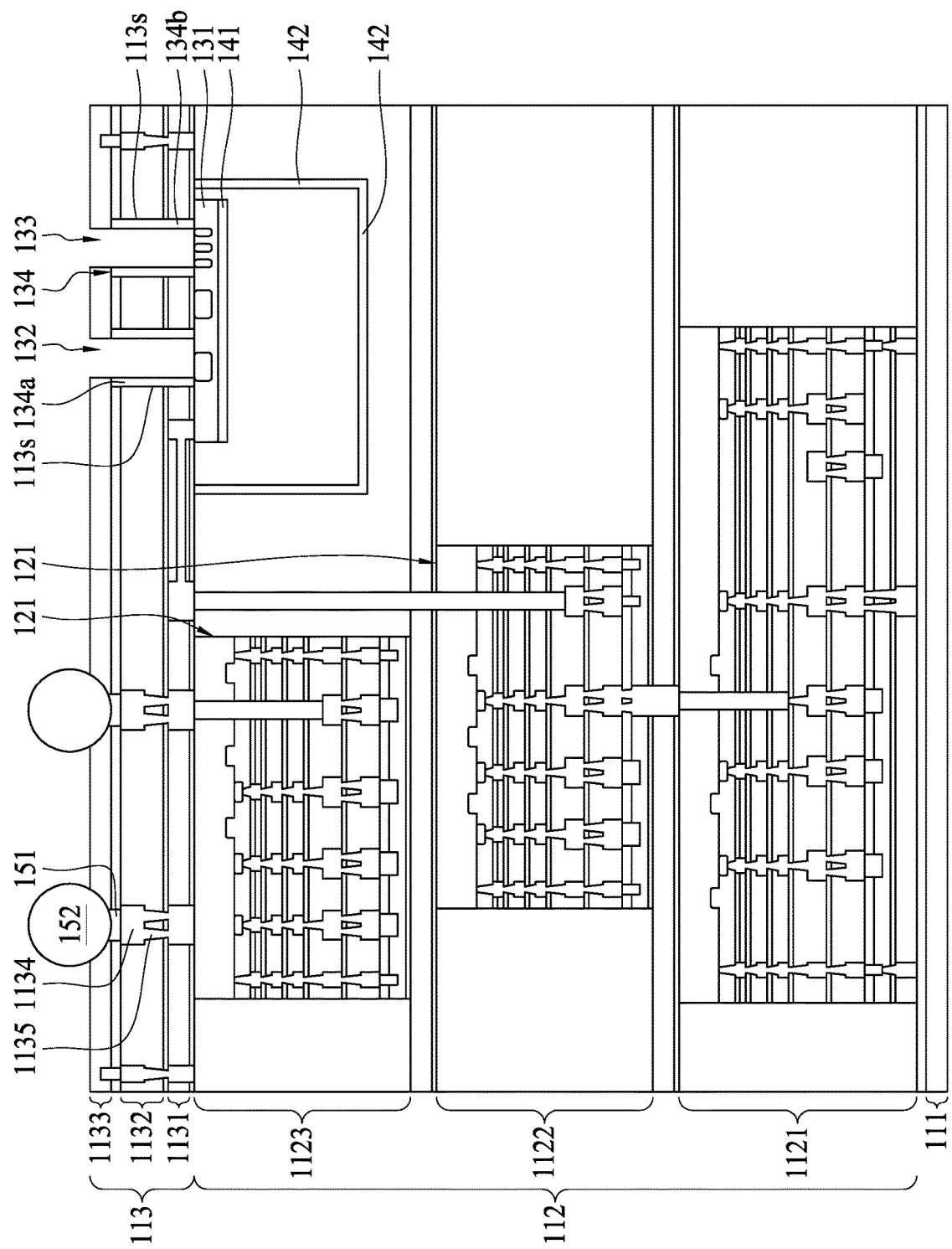

As illustrated in FIG. 27, in some embodiments, after the dielectric liner 134, the metallization layers 1134, and the vias 1135 are formed within the IMD layers 1131, 1132, a passivation layer 1133 is disposed over the dielectric liner 134, the metallization layers 1134, the vias 1135, and the IMD layers 1131, 1132. In some embodiments, a UBM pad 151 is formed within the RDL 113 and electrically connected to the metallization layers 1134 and the vias 1135. In some embodiments, a top surface of the RDL 113 is ground and polished.

Figure 28:
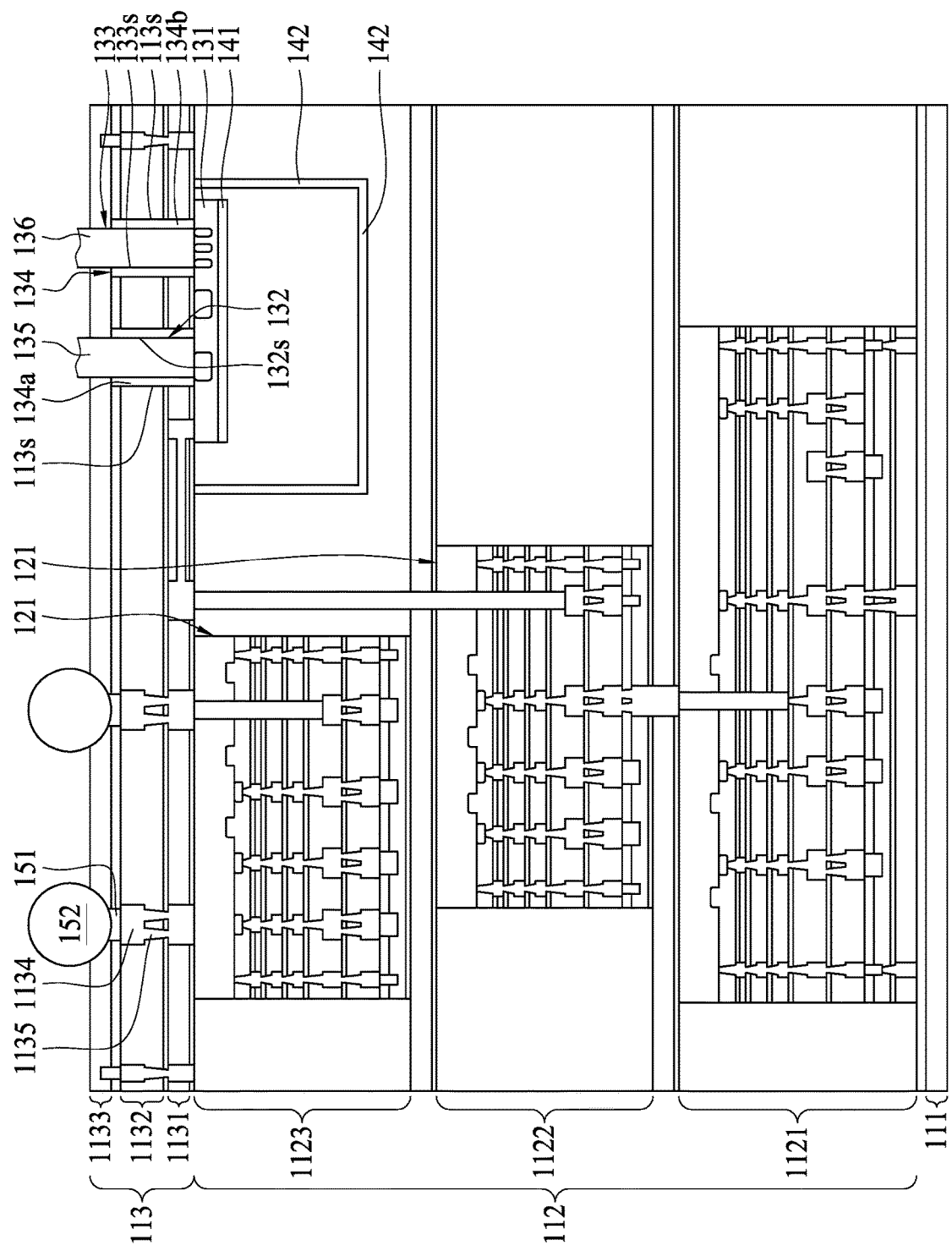

In some embodiments, as shown in FIG. 28, a first light-conducting member 135 is disposed in the first opening 132. In some embodiments, the first light-conducting member 135 is optically coupled to the photoelectric device 131. Similarly, a second light-conducting member 136 is disposed in the second opening 133. In some embodiments, the second light-conducting member 136 is optically coupled to the photoelectric device 131. In some embodiments, the first light-conducting member 135 is in contact with the dielectric liner 134, such as the first liner portion 134a Similarly, the second light-conducting member 136 is in contact with the dielectric liner 134, such as the second liner portion 134b.

In some embodiments, a conductive bump 152 is disposed on the UBM pad 151. In some embodiments, the conductive bump 152 is attached to the UBM pad 151 through a solder flux. In some embodiments, the conductive bump 152 is disposed on the redistribution layer 113 by a ball placement process and/or a reflowing process. In some embodiments, the formation of the conductive bump 152 includes performing a plating step to form solder regions over the UBM pad 151, and then reflowing the solder regions.

One aspect of this disclosure relates to a semiconductor structure. The semiconductor structure includes a die, a dielectric layer surrounding the die, a photoelectric device disposed adjacent to the die and surrounded by the dielectric layer, a first opening extending through the redistribution layer and configured to receive a light-conducting member, and a dielectric liner extending at least partially through the redistribution layer and surrounding the first opening.

In some embodiments, the photoelectric device is at least partially exposed through the first opening. In some embodiments, a material of the redistribution layer and a material of the dielectric liner are different. In some embodiments, wherein the dielectric liner is disposed along a sidewall of the redistribution layer or a sidewall of the first opening. In some embodiments, the first light-conducting member is coupled to the photoelectric device through the first opening. In some embodiments, the redistribution layer extends along a first direction, and the dielectric liner extends along a second direction substantially perpendicular to the first direction. In some embodiments, the semiconductor structure further includes a first light blocking layer disposed between the photoelectric device and the dielectric layer and including dielectric material. In some embodiments, the photoelectric device is in contact with the dielectric liner. In some embodiments, the semiconductor structure further includes a second opening extending through the redistribution layer, configured to receive a second light-conducting member and surrounded by the dielectric liner. In some embodiments, the semiconductor structure further includes a second light blocking layer disposed within the dielectric layer and surrounding the photoelectric device. In some embodiments, the second light blocking layer includes dielectric material or metallic material. In some embodiments, the die and the photoelectric device are electrically connected.

An aspect of this disclosure relates to a semiconductor structure. The semiconductor structure includes a die, a dielectric layer surrounding the die, a redistribution layer over the dielectric layer, a photoelectric device disposed adjacent to the die and between the dielectric layer and the redistribution layer, a light-conducting member extending through the redistribution layer and optically coupled to the photoelectric device, and a dielectric liner extending at least partially through the redistribution layer and surrounding the light-conducting member.

In some embodiments, the semiconductor structure further includes a conductive bump disposed over the redistribution layer and electrically connected to the die through the redistribution layer. In some embodiments, the light-conducting member is an optical fiber. In some embodiments, the semiconductor structure further includes a second die disposed under the die and electrically connected to the photoelectric device through the redistribution layer. In some embodiments, the die and the photoelectric device are laterally offset from a top view.

An aspect of this disclosure relates to a method for forming a semiconductor structure. The method includes receiving a die; forming a dielectric layer to surround the die; and disposing a photoelectric device surrounded by the dielectric layer. The method further includes forming a redistribution layer over the die, the dielectric layer and the photoelectric device; removing a portion of the redistribution layer to form a first recess over the photoelectric device; and disposing a dielectric material into the first recess and over the photoelectric device. The method further includes removing a portion of the dielectric material to form a dielectric liner and a first opening over the photoelectric device. The dielectric liner extends at least partially through the redistribution layer and surrounding the first opening.

In some embodiments, the method further includes removing a portion of the dielectric layer to form a second recess; and disposing a first light blocking layer within the second recess, wherein the photoelectric device is disposed over the first light blocking layer. In some embodiments, the method further includes removing a portion of the dielectric layer to form a third recess; and disposing a second light blocking layer within the recess, wherein the disposing of the photoelectric device is performed after the disposing of the second light blocking layer, and the photoelectric device is surrounded by the second light blocking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a die;
   a dielectric layer surrounding the die;
   a photoelectric device disposed adjacent to the die and surrounded by the dielectric layer;
   a redistribution layer disposed over the die, the dielectric layer and the photoelectric device;
   a first opening extending through the redistribution layer and configured to receive a first light-conducting member;
   a dielectric liner extending at least partially through the redistribution layer and surrounding the first opening;
   a first light blocking layer in contact with the photoelectric device; and
   a second light blocking layer disposed within the dielectric layer and surrounding the photoelectric device and the first light blocking layer, wherein the second light blocking layer is separated from the first light blocking layer and the photoelectric device by the dielectric layer.

2. The semiconductor structure of claim 1, wherein the photoelectric device is at least partially exposed through the first opening.

3. The semiconductor structure of claim 1, wherein the dielectric liner is enclosed by the redistribution layer.

4. The semiconductor structure of claim 1, wherein the dielectric liner is disposed along a sidewall of the redistribution layer or a sidewall of the first opening.

5. The semiconductor structure of claim 1, wherein the first light-conducting member is an optical fiber and is coupled to the photoelectric device through the first opening.

6. The semiconductor structure of claim 1, wherein the redistribution layer extends along a first direction, and the dielectric liner extends along a second direction substantially perpendicular to the first direction.

7. The semiconductor structure of claim 1, wherein the first light blocking layer is attached to an entire bottom surface of the photoelectric device.

8. The semiconductor structure of claim 1, wherein the second light blocking layer is enclosed by the dielectric layer and the redistribution layer.

9. The semiconductor structure of claim 1, further comprising a second opening extending through the redistribution layer, configured to receive a second light-conducting member and surrounded by the dielectric liner.

10. The semiconductor structure of claim 1, wherein a portion of the dielectric layer is disposed between the first light blocking layer and the second light blocking layer.

11. The semiconductor structure of claim 1, wherein the second light blocking layer includes dielectric material or metallic material.

12. The semiconductor structure of claim 1, wherein the second light blocking layer at least partially contacts the redistribution layer.

13. A semiconductor structure, comprising:
a die;
a dielectric layer surrounding the die;
a redistribution layer over the dielectric layer;
a photoelectric device disposed adjacent to the die and between the dielectric layer and the redistribution layer;
a light-conducting member extending through the redistribution layer and optically coupled to the photoelectric device; and
a dielectric liner extending at least partially through the redistribution layer and surrounding the light-conducting member;
wherein the photoelectric device is in contact with the dielectric liner and the light-conducting member, the dielectric liner is disposed between the redistribution layer and the light-conducting member and includes a first sub-layer surrounding the light-conducting member and a second sub-layer surrounding the first sub-layer, and the first sub-layer is separated from the second sub-layer by the redistribution layer.

14. The semiconductor structure of claim 13, further comprising a conductive bump disposed over the redistribution layer and electrically connected to the die through the redistribution layer.

15. The semiconductor structure of claim 13, wherein the first sub-layer and the second sub-layer include different dielectric materials.

16. The semiconductor structure of claim 13, further comprising a second die disposed under the die and electrically connected to the photoelectric device through the redistribution layer.

17. The semiconductor structure of claim 13, wherein the first sub-layer is enclosed by the second sub-layer from a top view.

18. A semiconductor structure, comprising:
a die;
a dielectric layer surrounding the die;
a photoelectric device disposed adjacent to the die and surrounded by the dielectric layer;
a first light blocking layer disposed between the dielectric layer and the photoelectric device, and in contact with the photoelectric device;
a second light blocking layer disposed within the dielectric layer and surrounding the photoelectric device;
a redistribution layer disposed over the die, the dielectric layer and the photoelectric device;
an opening extending through the redistribution layer and towards the photoelectric device;
a light-conducting member extending within the opening and optically coupled to and in contact with the photoelectric device; and
a dielectric liner extending from the photoelectric device and at least partially through the redistribution layer and partially surrounding the opening and the light-conducting member,
wherein the photoelectric device is in contact with the dielectric liner, the first light blocking layer is surrounded by the second light blocking layer, and the light-conducting member is isolated from the dielectric liner by the redistribution layer.

19. The semiconductor structure of claim 18, wherein the redistribution layer surrounds the dielectric liner.

20. The semiconductor structure of claim 18, wherein the dielectric liner is disposed between the redistribution layer and the light-conducting member and includes a first sub-layer surrounding the light-conducting member and a second sub-layer surrounding the first sub-layer, and the first sub-layer and the second sub-layer include different dielectric materials.

* * * * *